(12) United States Patent
Li et al.

(10) Patent No.: US 10,778,234 B2
(45) Date of Patent: Sep. 15, 2020

(54) CLOCK GENERATION CIRCUIT AND CLOCK SIGNAL GENERATION METHOD

(71) Applicant: HUAWEI TECHNOLOGIES CO., LTD., Shenzhen, Guangdong (CN)

(72) Inventors: Hua Li, Beijing (CN); Yan Gao, Beijing (CN); Sheng Ma, Beijing (CN)

(73) Assignee: HUAWEI TECHNOLOGIES CO., LTD., Shenzhen, Guangdong (CN)

(*) Notice: Subject to any disclaimer, the term of this patent is extended or adjusted under 35 U.S.C. 154(b) by 0 days.

(21) Appl. No.: 16/204,790

(22) Filed: Nov. 29, 2018

(65) Prior Publication Data

US 2019/0097642 A1 Mar. 28, 2019

Related U.S. Application Data

(63) Continuation of application No. PCT/CN2016/084178, filed on May 31, 2016.

(51) Int. Cl.
*H03L 7/099* (2006.01)
*H03L 7/08* (2006.01)
*G06F 11/16* (2006.01)

(52) U.S. Cl.
CPC .......... *H03L 7/099* (2013.01); *G06F 11/1604* (2013.01); *H03L 7/08* (2013.01)

(58) Field of Classification Search
CPC ........ G06F 11/00; G06F 11/1604; G11C 7/00; G11C 7/222; H03L 7/00; H03L 7/08; H03L 7/0805; H03L 7/0812; H03L 7/0814; H03L 7/087; H03L 7/099

USPC .......................................................... 327/158
See application file for complete search history.

(56) References Cited

U.S. PATENT DOCUMENTS

| | | | | |
|---|---|---|---|---|
| 5,852,728 A | * | 12/1998 | Matsuda | ............... G06F 1/04 713/501 |
| 8,547,146 B1 | | 10/2013 | Kelly et al. | |
| 2013/0265088 A1 | * | 10/2013 | Kelly | .................. H02H 5/005 327/142 |
| 2014/0281037 A1 | | 9/2014 | Spada et al. | |
| 2015/0227162 A1 | | 8/2015 | Zhu et al. | |

FOREIGN PATENT DOCUMENTS

| | | |
|---|---|---|
| CN | 101079630 A | 11/2007 |
| CN | 101667906 A | 3/2010 |
| CN | 101719837 A | 6/2010 |

(Continued)

*Primary Examiner* — Lincoln D Donovan
*Assistant Examiner* — Dave Mattison
(74) *Attorney, Agent, or Firm* — Womble Bond Dickinson (US) LLP

(57) ABSTRACT

A clock generation circuit and a clock signal generation method are disclosed. In the method, a direct current bias circuit in a first clock source superimposes a first direct current voltage on a first clock signal output by a first oscillation circuit, to generate a second clock signal; and a logical operation is performed on the second clock signal and a third clock signal that is generated by a second clock source, to generate a fourth clock signal. The fourth clock signal is used as a signal output by a clock generation circuit. In the method, when the first oscillation circuit cannot normally work, the clock generation circuit can still output a correct clock signal. This avoids clock signal interruption when switching is performed from the first clock source to the second clock source.

20 Claims, 12 Drawing Sheets

(56) References Cited

FOREIGN PATENT DOCUMENTS

| EP | 2648300 | A1 | 10/2013 |
|---|---|---|---|
| JP | H04158420 | A | 6/1992 |
| JP | 09-284182 | A | 10/1997 |
| JP | 2996290 | B2 | 12/1999 |
| WO | 00/70801 | A1 | 11/2000 |

\* cited by examiner

CLOCK GENERATION CIRCUIT AND CLOCK SIGNAL GENERATION METHOD

CROSS-REFERENCE TO RELATED APPLICATIONS

This application is a continuation of International Application No. PCT/CN2016/084178, filed on May 31, 2016, the disclosure of which is hereby incorporated by reference in its entirety.

TECHNICAL FIELD

This application relates to the field of circuit technologies, and in particular, to a clock generation circuit and a clock signal generation method.

BACKGROUND

A clock signal provides a periodic pulse sequence to a component in a digital circuit, and ensures normal working of the digital circuit. The clock signal may be generated using a clock generation circuit. The clock generation circuit usually includes a clock source, and an oscillation circuit in the clock source is used to generate a periodic pulse used as a clock signal.

To improve reliability of the clock generation circuit, two clock sources such as a primary clock source and a secondary clock source may be arranged in the clock generation circuit. The primary clock source and the secondary clock source each generate a clock signal. A dedicated detection circuit is arranged in the clock generation circuit to detect whether the primary clock source has a failure, and when it is detected that no clock signal is output from the primary clock source, a clock signal from the secondary clock source is output. In the foregoing method, a time period needs to be taken from a time at which the primary clock source stops outputting a clock signal to a time at which the detection circuit detects that the primary clock source stops outputting a clock signal and the secondary clock source is selected. In this time period, the clock generation circuit cannot provide a correct clock signal.

In conclusion, in a current clock generation circuit, a problem that a clock signal output by the clock generation circuit is interrupted when a clock source cannot normally work occurs.

SUMMARY

In view of this, a clock generation circuit and a clock signal generation method are provided, to resolve a problem that a clock signal output by a clock generation circuit is interrupted when a clock source cannot normally work.

According to a first aspect, an embodiment of this application provides a clock generation circuit, where the clock generation circuit includes a first clock source, a second clock source, and a logic gate circuit.

The first clock source is coupled to the logic gate circuit and the second clock source is coupled to the logic gate circuit, the first clock source includes a first oscillation circuit and a first direct current bias circuit, the first oscillation circuit is coupled to the first direct current bias circuit, and the first direct current bias circuit is coupled to the logic gate circuit, where the first oscillation circuit is configured to generate a first clock signal; and the first direct current bias circuit is configured to: remove a direct current component from the first clock signal, and superimpose a first direct current voltage on the first clock signal obtained after the direct current component is removed, to generate a second clock signal, where a voltage value of the first direct current voltage is greater than a high-level decision threshold of the logic gate circuit, and the voltage value of the first direct current voltage is less than a difference between a low-level decision threshold of the logic gate circuit and a low-level voltage value of the first clock signal;

the second clock source is configured to generate a third clock signal, where an absolute value of a difference between a frequency of the third clock signal and a frequency of the second clock signal is less than a first preset value; and the logic gate circuit is configured to: receive the second clock signal and the third clock signal, and perform an AND logical operation on the second clock signal and the third clock signal to generate a fourth clock signal.

By means of the foregoing solution, the first direct current bias circuit in the first clock source superimposes a first direct current voltage on a first clock signal output by the first oscillation circuit, to generate a second clock signal. An AND logical operation is performed on the second clock signal and a third clock signal that is generated by the second clock source, to generate a fourth clock signal. Therefore, when the first oscillation circuit cannot normally work, a clock generation circuit can still output a correct clock signal. This avoids clock signal interruption when switching is performed from the first clock source to the second clock source.

In a possible implementation, the second clock source includes a second oscillation circuit and a second direct current bias circuit, the second oscillation circuit is coupled to the second direct current bias circuit, and the second direct current bias circuit is coupled to the logic gate circuit, where the second oscillation circuit is configured to generate a fifth clock signal; and the second direct current bias circuit is configured to: remove a direct current component from the fifth clock signal, and superimpose a second direct current voltage on the fifth clock signal obtained after the direct current component is removed, to generate the third clock signal, where a voltage value of the second direct current voltage is greater than the high-level decision threshold of the logic gate circuit, and the voltage value of the second direct current voltage is less than a difference between the low-level decision threshold of the logic gate circuit and a low-level voltage value of the fifth clock signal.

By means of the foregoing solution, the second direct current bias circuit in the second clock source superimposes a second direct current voltage on a fifth clock signal output by the second oscillation circuit, to generate a third clock signal. An AND logical operation is performed on the third clock signal and a second clock signal that is generated by the first clock source, to generate a fourth clock signal. Therefore, regardless of whether the first clock source or the second clock source fails, the clock generation circuit can output a correct clock signal. This avoids clock signal interruption after the first clock source or the second clock source fails.

In a possible implementation, the second clock source is a controlled clock source, and the clock generation circuit further includes a control circuit, where the control circuit is configured to: generate a control signal according to a phase difference and/or a frequency difference between the second clock signal and the third clock signal, and send the control signal to the second clock source; and the control signal is used to control the frequency of the third clock signal, so that the absolute value of the difference between the frequency of the third clock signal and the frequency of the second clock signal is less than the first preset value.

By means of the foregoing solution, frequency and/or phase adjustment can be implemented for the second clock source, that is, the controlled clock source, by means of control by the control circuit.

In a possible implementation, a first delay circuit is further coupled between the first oscillation circuit and the logic gate circuit; and the first delay circuit is configured to delay the second clock signal, so that a difference between a time at which the first direct current bias circuit outputs the second clock signal and a time at which the logic gate circuit receives the second clock signal is a first duration; or the first delay circuit is configured to delay the first clock signal, so that a difference between a time at which the first oscillation circuit outputs the first clock signal and a time at which the first direct current bias circuit receives the first clock signal is a second duration.

By means of the foregoing solution, a rising edge of a clock signal output by the clock generation circuit can be selected on purpose by coupling the first delay circuit between the first oscillation circuit and the logic gate circuit.

In a possible implementation, a second delay circuit is further coupled between the second clock source and the logic gate circuit; and the second delay circuit is configured to delay the third clock signal, so that a difference between a time at which the second clock source outputs the third clock signal and a time at which the logic gate circuit receives the third clock signal is the first duration.

By means of the foregoing solution, a rising edge of a clock signal output by the clock generation circuit can be selected on purpose by coupling the second delay circuit between the second clock source and the logic gate circuit.

In a possible implementation, a second delay circuit is further coupled between the second oscillation circuit and the logic gate circuit; and the second delay circuit is configured to delay the third clock signal, so that a difference between a time at which the second direct current bias circuit outputs the third clock signal and a time at which the logic gate circuit receives the third clock signal is the first duration; or the second delay circuit is configured to delay the fifth clock signal, so that a difference between a time at which the second oscillation circuit outputs the fifth clock signal and a time at which the second direct current bias circuit receives the fifth clock signal is the second duration.

By means of the foregoing solution, a rising edge of a clock signal output by the clock generation circuit can be selected on purpose by coupling the second delay circuit between the second oscillation circuit and the logic gate circuit.

In a possible implementation, a time at which the logic gate circuit receives a rising edge of the second clock signal is earlier than a time at which the logic gate circuit receives a rising edge of the third clock signal, and a difference between the time at which the logic gate circuit receives the rising edge of the second clock signal and the time at which the logic gate circuit receives the rising edge of the third clock signal is less than a high-level duration of the second clock signal; or a time at which the logic gate circuit receives a rising edge of the second clock signal is later than a time at which the logic gate circuit receives a rising edge of the third clock signal, and a difference between the time at which the logic gate circuit receives the rising edge of the third clock signal and the time at which the logic gate circuit receives the rising edge of the second clock signal is less than a high-level duration of the third clock signal.

According to a second aspect, an embodiment of this application provides a clock signal generation method, where the method is applied to a clock generation circuit, the clock generation circuit includes a first clock source, a second clock source, and a logic gate circuit, and the first clock source includes a first oscillation circuit and a first direct current bias circuit; and the method includes:

generating, by the first oscillation circuit, a first clock signal;

sending, by the first oscillation circuit, the first clock signal to the first direct current bias circuit; and removing, by the first direct current bias circuit, a direct current component from the first clock signal, and superimposing a first direct current voltage on the first clock signal obtained after the direct current component is removed, to generate a second clock signal, where a voltage value of the first direct current voltage is greater than a high-level decision threshold of the logic gate circuit, and the voltage value of the first direct current voltage is less than a difference between a low-level decision threshold of the logic gate circuit and a low-level voltage value of the second clock signal;

generating, by the second clock source, a third clock signal, where a difference between frequencies of the third clock signal and the second clock signal is less than a first preset value; and receiving, by the logic gate circuit, the second clock signal and the third clock signal, and performing an AND logical operation on the second clock signal and the third clock signal to generate a fourth clock signal.

By means of the foregoing solution, a first direct current bias circuit in a first clock source superimposes a first direct current voltage on a first clock signal output by a first oscillation circuit, to generate a second clock signal. An AND logical operation is performed on the second clock signal and a third clock signal that is generated by a second clock source, to generate a fourth clock signal. Therefore, when the first oscillation circuit cannot normally work, a clock generation circuit can still output a correct clock signal. This avoids clock signal interruption when switching is performed from the first clock source to the second clock source.

In a possible implementation, the second clock source includes a second oscillation circuit and a second direct current bias circuit; and the generating, by the second clock source, a third clock signal includes:

generating, by the second oscillation circuit, a fifth clock signal; and sending, by the second oscillation circuit, the fifth clock signal to the second direct current bias circuit; and removing, by the second direct current bias circuit, a direct current component from the fifth clock signal, and superimposing a second direct current voltage on the fifth clock signal obtained after the direct current component is removed, to generate the third clock signal, where a voltage value of the second direct current voltage is greater than the high-level decision threshold of the logic gate circuit, and the voltage value of the second direct current voltage is less than a difference between the low-level decision threshold of the logic gate circuit and a low-level voltage value of the fifth clock signal.

By means of the foregoing solution, a second direct current bias circuit in a second clock source superimposes a second direct current voltage on a fifth clock signal output by a second oscillation circuit, to generate a third clock signal. An AND logical operation is performed on the third clock signal and a second clock signal that is generated by a first clock source, to generate a fourth clock signal. Therefore, regardless of whether the first clock source or the second clock source fails, a clock generation circuit can output a correct clock signal. This avoids clock signal interruption after the first clock source or the second clock source fails.

In a possible implementation, the second clock source is a controlled clock source, and the clock generation circuit further includes a control circuit; and the method further includes:

generating, by the control circuit, a control signal according to a phase difference and/or a frequency difference between the second clock signal and the third clock signal, and sending the control signal to the second clock source; and the control signal is used to control the frequency of the third clock signal, so that an absolute value of the difference between the frequency of the third clock signal and the frequency of the second clock signal is less than the first preset value.

By means of the foregoing solution, frequency and/or phase adjustment can be implemented for a second clock source, that is, a controlled clock source, by means of control by a control circuit.

In a possible implementation, the clock generation circuit further includes a first delay circuit, and the method further includes:

delaying, by the first delay circuit, the second clock signal, so that a difference between a time at which the first direct current bias circuit outputs the second clock signal and a time at which the logic gate circuit receives the second clock signal is a first duration; or delaying, by the first delay circuit, the first clock signal, so that a difference between a time at which the first oscillation circuit outputs the first clock signal and a time at which the first direct current bias circuit receives the first clock signal is a second duration.

By means of the foregoing solution, a rising edge of a clock signal output by a clock generation circuit can be selected on purpose by delaying a second clock signal or a first clock signal using a first delay circuit.

In a possible implementation, the clock generation circuit further includes a second delay circuit, and the method further includes:

delaying, by the second delay circuit, the third clock signal, so that a difference between a time at which the second clock source outputs the third clock signal and a time at which the logic gate circuit receives the third clock signal is the first duration.

By means of the foregoing solution, a rising edge of a clock signal output by a clock generation circuit can be selected on purpose by delaying a third clock signal using a second delay circuit.

In a possible implementation, the clock generation circuit further includes a second delay circuit, and the method further includes:

delaying, by the second delay circuit, the third clock signal, so that a difference between a time at which the second direct current bias circuit outputs the third clock signal and a time at which the logic gate circuit receives the third clock signal is the first duration; or delaying, by the second delay circuit, the fifth clock signal, so that a difference between a time at which the second oscillation circuit outputs the fifth clock signal and a time at which the second direct current bias circuit receives the fifth clock signal is the second duration.

By means of the foregoing solution, a rising edge of a clock signal output by a clock generation circuit can be selected on purpose by delaying a third clock signal or a fifth clock signal using a second delay circuit.

In a possible implementation, a time at which the logic gate circuit receives a rising edge of the second clock signal is earlier than a time at which the logic gate circuit receives a rising edge of the third clock signal, and a difference between the time at which the logic gate circuit receives the rising edge of the second clock signal and the time at which the logic gate circuit receives the rising edge of the third clock signal is less than a high-level duration of the second clock signal; or a time at which the logic gate circuit receives a rising edge of the second clock signal is later than a time at which the logic gate circuit receives a rising edge of the third clock signal, and a difference between the time at which the logic gate circuit receives the rising edge of the third clock signal and the time at which the logic gate circuit receives the rising edge of the second clock signal is less than a high-level duration of the third clock signal.

According to a third aspect, an embodiment of this application provides a clock generation circuit, where the clock generation circuit includes a first clock source, a second clock source, and a logic gate circuit, where the first clock source is coupled to the logic gate circuit and the second clock source is coupled to the logic gate circuit.

The first clock source includes a first oscillation circuit and a first direct current bias circuit, the first oscillation circuit is coupled to the first direct current bias circuit, and the first direct current bias circuit is coupled to the logic gate circuit, where the first oscillation circuit is configured to generate a first clock signal;

the first direct current bias circuit is configured to: remove a direct current component from the first clock signal, and superimpose a first direct current voltage on the first clock signal obtained after the direct current component is removed, to generate a second clock signal, where a voltage value of the first direct current voltage is less than a low-level decision threshold of the logic gate circuit, and the voltage value of the first direct current voltage is greater than a difference between a high-level decision threshold of the logic gate circuit and a high-level voltage value of the first clock signal;

the second clock source is configured to generate a third clock signal, where an absolute value of a difference between a frequency of the third clock signal and a frequency of the second clock signal is less than a first preset value; and the logic gate circuit is configured to: receive the second clock signal and the third clock signal, and perform an OR logical operation on the second clock signal and the third clock signal to generate a fourth clock signal.

By means of the foregoing solution, the first direct current bias circuit in the first clock source superimposes a first direct current voltage on a first clock signal output by the first oscillation circuit, to generate a second clock signal. An OR logical operation is performed on the second clock signal and a third clock signal that is generated by the second clock source, to generate a fourth clock signal. Therefore, when the first oscillation circuit cannot normally work, a clock generation circuit can still output a correct clock signal. This avoids clock signal interruption when switching is performed from the first clock source to the second clock source.

In a possible implementation, the second clock source includes a second oscillation circuit and a second direct current bias circuit, the second oscillation circuit is coupled to the second direct current bias circuit, and the second direct current bias circuit is coupled to the logic gate circuit, where the second oscillation circuit is configured to generate a fifth clock signal; and the second direct current bias circuit is configured to: remove a direct current component from the fifth clock signal, and superimpose a second direct current voltage on the fifth clock signal obtained after the direct current component is removed, to generate the third clock signal, where a voltage value of the second direct current voltage is less than the low-level decision threshold of the logic gate circuit, and the voltage value of the second direct current voltage is greater than a difference between the high-level decision threshold of the logic gate circuit and a high-level voltage value of the fifth clock signal.

By means of the foregoing solution, the second direct current bias circuit in the second clock source superimposes a second direct current voltage on a fifth clock signal output by the second oscillation circuit, to generate a third clock signal. An OR logical operation is performed on the third clock signal and a second clock signal that is generated by the first clock source, to generate a fourth clock signal. Therefore, regardless of whether the first clock source or the second clock source fails, the clock generation circuit can output a correct clock signal. This avoids clock signal interruption after the first clock source or the second clock source fails.

In a possible implementation, the second clock source is a controlled clock source, and the clock generation circuit further includes a control circuit, where the control circuit is configured to: generate a control signal according to a phase difference and/or a frequency difference between the second clock signal and the third clock signal, and send the control signal to the second clock source; and the control signal is used to control the frequency of the third clock signal, so that an absolute value of the difference between the frequency of the third clock signal and the frequency of the second clock signal is less than the first preset value.

By means of the foregoing solution, frequency and/or phase adjustment can be implemented for the second clock source, that is, the controlled clock source, by means of control by the control circuit.

In a possible implementation, a first delay circuit is further coupled between the first oscillation circuit and the logic gate circuit; and the first delay circuit is configured to delay the second clock signal, so that a difference between a time at which the first direct current bias circuit outputs the second clock signal and a time at which the logic gate circuit receives the second clock signal is a first duration; or the first delay circuit is configured to delay the first clock signal, so that a difference between a time at which the first oscillation circuit outputs the first clock signal and a time at which the first direct current bias circuit receives the first clock signal is a second duration.

By means of the foregoing solution, a rising edge of a clock signal output by the clock generation circuit can be selected on purpose by coupling the first delay circuit between the first oscillation circuit and the logic gate circuit.

In a possible implementation, a second delay circuit is further coupled between the second clock source and the logic gate circuit; and the second delay circuit is configured to delay the third clock signal, so that a difference between a time at which the second clock source outputs the third clock signal and a time at which the logic gate circuit receives the third clock signal is the first duration.

By means of the foregoing solution, a rising edge of a clock signal output by the clock generation circuit can be selected on purpose by coupling the second delay circuit between the second clock source and the logic gate circuit.

In a possible implementation, a second delay circuit is further coupled between the second oscillation circuit and the logic gate circuit; and the second delay circuit is configured to delay the third clock signal, so that a difference between a time at which the second direct current bias circuit outputs the third clock signal and a time at which the logic gate circuit receives the third clock signal is the first duration; or the second delay circuit is configured to delay the fifth clock signal, so that a difference between a time at which the second oscillation circuit outputs the fifth clock signal and a time at which the second direct current bias circuit receives the fifth clock signal is the second duration.

By means of the foregoing solution, a rising edge of a clock signal output by the clock generation circuit can be selected on purpose by coupling the second delay circuit between the second oscillation circuit and the logic gate circuit.

In a possible implementation, a time at which the logic gate circuit receives a falling edge of the second clock signal is earlier than a time at which the logic gate circuit receives a falling edge of the third clock signal, and a difference between the time at which the logic gate circuit receives the falling edge of the second clock signal and the time at which the logic gate circuit receives the falling edge of the third clock signal is less than a low-level duration of the second clock signal; or a time at which the logic gate circuit receives a falling edge of the second clock signal is later than a time at which the logic gate circuit receives a falling edge of the third clock signal, and a difference between the time at which the logic gate circuit receives the falling edge of the third clock signal and the time at which the logic gate circuit receives the falling edge of the second clock signal is less than a low-level duration of the third clock signal.

According to a fourth aspect, an embodiment of this application provides a clock signal generation method, where the method is applied to a clock generation circuit, the clock generation circuit includes a first clock source, a second clock source, and a logic gate circuit, and the first clock source includes a first oscillation circuit and a first direct current bias circuit; and the method includes:

generating, by the first oscillation circuit, a first clock signal;

sending, by the first oscillation circuit, the first clock signal to the first direct current bias circuit;

removing, by the first direct current bias circuit, a direct current component from the first clock signal, and superimposing a first direct current voltage on the first clock signal obtained after the direct current component is removed, to generate a second clock signal, where a voltage value of the first direct current voltage is less than a low-level decision threshold of the logic gate circuit, and the voltage value of the first direct current voltage is greater than a difference between a high-level decision threshold of the logic gate circuit and a high-level voltage value of the second clock signal;

generating, by the second clock source, a third clock signal, where a difference between frequencies of the third clock signal and the second clock signal is less than a first preset value; and receiving, by the logic gate circuit, the second clock signal and the third clock signal, and performing an OR logical operation on the second clock signal and the third clock signal to generate a fourth clock signal.

By means of the foregoing solution, a first direct current bias circuit in a first clock source superimposes a first direct current voltage on a first clock signal output by a first oscillation circuit, to generate a second clock signal. An OR logical operation is performed on the second clock signal and a third clock signal that is generated by a second clock source, to generate a fourth clock signal. Therefore, when the first oscillation circuit cannot normally work, a clock generation circuit can still output a correct clock signal. This avoids clock signal interruption when switching is performed from the first clock source to the second clock source.

In a possible implementation, the second clock source includes a second oscillation circuit and a second direct current bias circuit; and the generating, by the second clock source, a third clock signal including:

generating, by the second oscillation circuit, a fifth clock signal; and sending, by the second oscillation circuit, the fifth clock signal to the second direct current bias circuit; and removing, by the second direct current bias circuit, a direct current component from the fifth clock signal, and superimposing a second direct current voltage on the fifth clock signal obtained after the direct current component is removed, to generate the third clock signal, where a voltage value of the second direct current voltage is less than the low-level decision threshold of the logic gate circuit, and the voltage value of the second direct current voltage is greater than a difference between the high-level decision threshold of the logic gate circuit and a high-level voltage value of the fifth clock signal.

By means of the foregoing solution, a second direct current bias circuit in a second clock source superimposes a second direct current voltage on a fifth clock signal output by a second oscillation circuit, to generate a third clock signal. An OR logical operation is performed on the third clock signal and a second clock signal that is generated by a first clock source, to generate a fourth clock signal. Therefore, regardless of whether the first clock source or the second clock source fails, a clock generation circuit can output a correct clock signal. This avoids clock signal interruption after the first clock source or the second clock source fails.

In a possible implementation, the second clock source is a controlled clock source, and the clock generation circuit further includes a control circuit; and the method further includes:

generating, by the control circuit, a control signal according to a phase difference and/or a frequency difference between the second clock signal and the third clock signal, and sending the control signal to the second clock source; and the control signal is used to control the frequency of the third clock signal, so that an absolute value of the difference between the frequency of the third clock signal and the frequency of the second clock signal is less than the first preset value.

By means of the foregoing solution, frequency and/or phase adjustment can be implemented for a second clock source, that is, a controlled clock source, by means of control by a control circuit.

In a possible implementation, the clock generation circuit further includes a first delay circuit, and the method further includes: delaying, by the first delay circuit, the second clock signal, so that a difference between a time at which the first direct current bias circuit outputs the second clock signal and a time at which the logic gate circuit receives the second clock signal is a first duration; or delaying, by the first delay circuit, the first clock signal, so that a difference between a time at which the first oscillation circuit outputs the first clock signal and a time at which the first direct current bias circuit receives the first clock signal is a second duration.

By means of the foregoing solution, a rising edge of a clock signal output by a clock generation circuit can be selected on purpose by delaying a second clock signal or a first clock signal using a first delay circuit.

In a possible implementation, the clock generation circuit further includes a second delay circuit, and the method further includes:

delaying, by the second delay circuit, the third clock signal, so that a difference between a time at which the second clock source outputs the third clock signal and a time at which the logic gate circuit receives the third clock signal is the first duration.

By means of the foregoing solution, a rising edge of a clock signal output by a clock generation circuit can be selected on purpose by delaying a third clock signal using a second delay circuit.

In a possible implementation, the clock generation circuit further includes a second delay circuit, and the method further includes:

delaying, by the second delay circuit, the third clock signal, so that a difference between a time at which the second direct current bias circuit outputs the third clock signal and a time at which the logic gate circuit receives the third clock signal is the first duration; or delaying, by the second delay circuit, the fifth clock signal, so that a difference between a time at which the second oscillation circuit outputs the fifth clock signal and a time at which the second direct current bias circuit receives the fifth clock signal is the second duration.

By means of the foregoing solution, a rising edge of a clock signal output by a clock generation circuit can be selected on purpose by delaying a third clock signal or a fifth clock signal using a second delay circuit.

In a possible implementation, a time at which the logic gate circuit receives a falling edge of the second clock signal is earlier than a time at which the logic gate circuit receives a falling edge of the third clock signal, and a difference between the time at which the logic gate circuit receives the falling edge of the second clock signal and the time at which the logic gate circuit receives the falling edge of the third clock signal is less than a low-level duration of the second clock signal; or a time at which the logic gate circuit receives a falling edge of the second clock signal is later than a time at which the logic gate circuit receives a falling edge of the third clock signal, and a difference between the time at which the logic gate circuit receives the falling edge of the third clock signal and the time at which the logic gate circuit receives the falling edge of the second clock signal is less than a low-level duration of the third clock signal.

DESCRIPTION OF EMBODIMENTS

To make the objectives, technical solutions, and advantages of this application more understandable, the following provides detailed descriptions. The detailed descriptions provide various implementations of a device and/or a method using block diagrams, flowcharts, and/or examples. These block diagrams, flowcharts, and/or examples include one or more functions and/or operations. Persons in the art may understand that each function and/or operation in the block diagrams, the flowcharts, and/or the examples can be performed independently and/or jointly using various hardware, software, and firmware, and/or any combination thereof.

In this application, a high-level decision threshold of a logic gate circuit refers to a preset voltage value. When a voltage value of a signal inputted into the logic gate circuit is greater than the preset voltage value, the logic gate circuit uses the inputted signal as logic "1".

In this application, a low-level decision threshold of a logic gate circuit refers to a preset voltage value. When a voltage value of a signal inputted into the logic gate circuit is less than the preset voltage value, the logic gate circuit uses the inputted signal as logic "0".

In this application, a clock signal refers to a clock pulse sequence of one or more consecutive periods. If each period of a pulse starts with a rising edge, a clock pulse of each period includes a rising edge, a high level, a falling edge, and a low level. Certainly, each period may start with another time of the clock pulse, for example, a start time of the high level. Duration of the periods of the clock signal is not necessarily completely equal. For example, in the embodiments of in this application, duration of each period of a signal output by a controlled clock source may vary within a tuning range of the controlled clock source.

Figure 1:
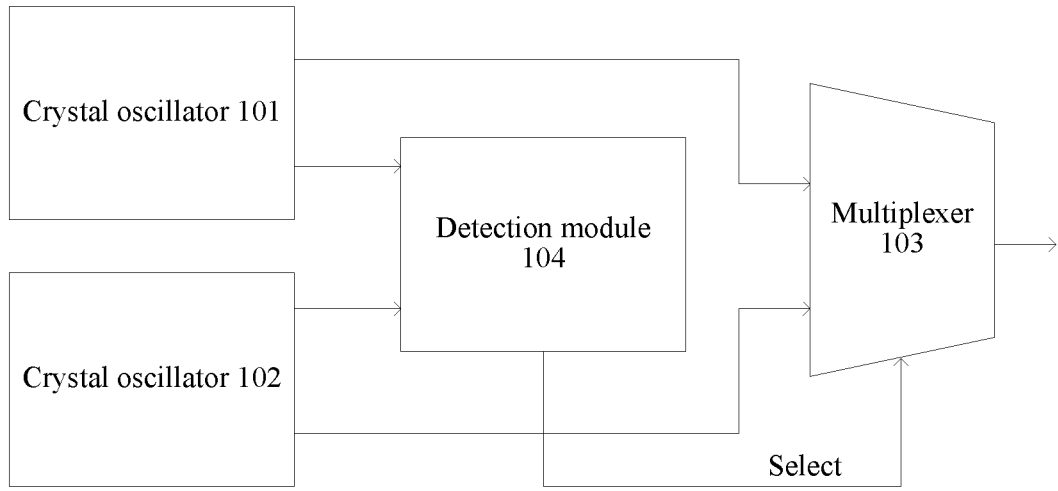
FIG. 1 shows a clock generation circuit in the prior art.
Figure 2:
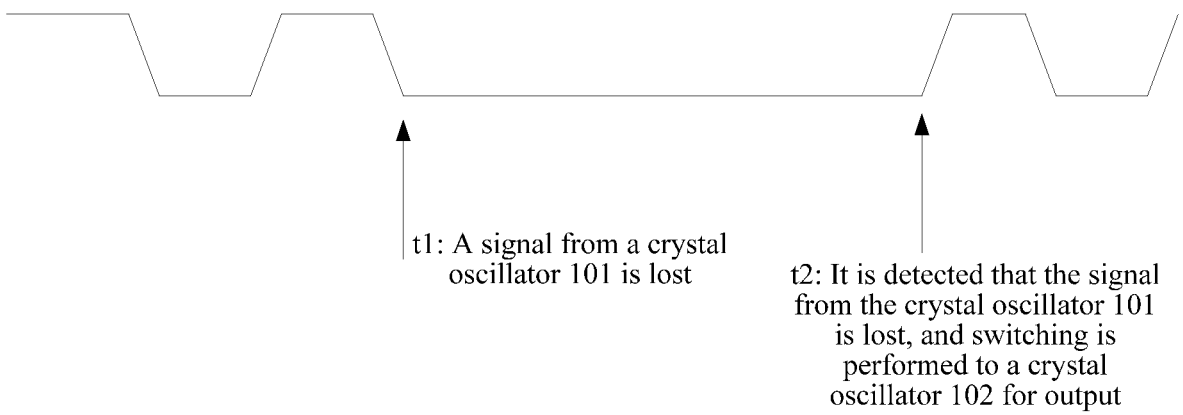
FIG. 2 is a schematic diagram of duration when a clock signal in the clock generation circuit shown in FIG. 1 is interrupted.

A commonly used clock generation circuit is shown in FIG. 1. A crystal oscillator 101 and a crystal oscillator 102 are connected to an output end using a multiplexer (Multiplexer, MUX) 103, and the output end outputs a clock pulse sequence, that is, a clock signal output by the clock generation circuit. Whether the multiplexer 103 selects a clock signal from the crystal oscillator 101 or from the crystal oscillator 102 is controlled by a detection module 104. A common selection method is: When the crystal oscillator 101 and the crystal oscillator 102 both normally work, the clock signal output by the crystal oscillator 101 is preferentially selected. When it is detected that the clock signal output by the crystal oscillator 101 is lost, the clock signal output by the crystal oscillator 102 is selected. In the clock generation circuit shown in FIG. 1, specific duration needs to be taken to complete a process from a time at which the clock signal output by the crystal oscillator 101 is lost, to a time at which the detection module 104 detects and reports that the clock signal output by the crystal oscillator 101 is lost and a time at which the clock generation circuit is switched to the crystal oscillator 102. As shown in FIG. 2, in duration from t1 to t2, the clock signal output by the clock generation circuit is interrupted, causing clock signal interruption. In addition, to ensure detection quality of the detection module 104, the detection module needs a clock source with higher precision to provide a clock signal, causing high costs.

To resolve a problem that a clock signal output by a clock generation circuit is interrupted when a clock source cannot normally work, in the embodiments of this application, a direct current bias circuit in a first clock source superimposes a first direct current voltage on a first clock signal output by a first oscillation circuit, to generate a second clock signal. A logical operation is performed on the second clock signal and a third clock signal that is generated by a second clock source, to generate a fourth clock signal.

Therefore, when the first oscillation circuit fails to work, a clock generation circuit can still output a correct clock signal. This avoids clock signal interruption when switching is performed from the first clock source to the second clock source.

The following describes the embodiments of this application in detail with reference to the accompanying drawings.

Figure 3:
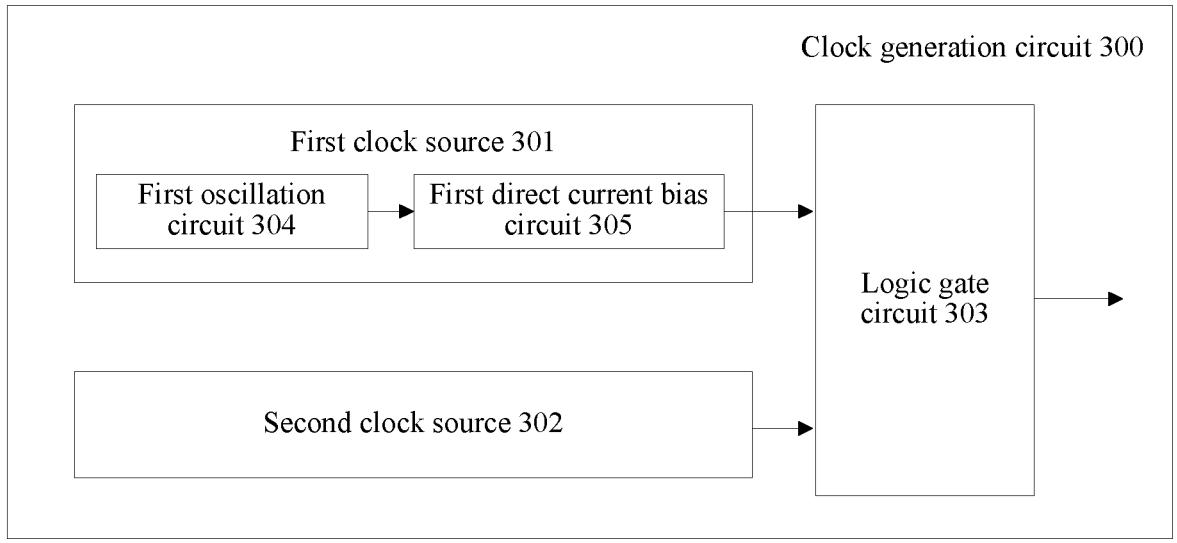
FIG. 3 shows a first clock generation circuit according to an embodiment of this application.

An embodiment of this application provides a clock generation circuit 300. As shown in FIG. 3, the clock generation circuit 300 includes a first clock source 301, a second clock source 302, and a logic gate circuit 303. The first clock source 301 is coupled to the logic gate circuit 303, and the second clock source 302 is coupled to the logic gate circuit 303. The first clock source 301 includes a first oscillation circuit 304 and a first direct current bias circuit 305, the first oscillation circuit 304 is coupled to the first direct current bias circuit 305, and the first direct current bias circuit 305 is coupled to the logic gate circuit 303.

The first oscillation circuit 304 is configured to generate a first clock signal.

The first direct current bias circuit 305 is configured to: remove a direct current component from the first clock signal, and superimpose a first direct current voltage on the first clock signal obtained after the direct current component is removed, to generate a second clock signal, where a voltage value of the first direct current voltage is greater than a high-level decision threshold of the logic gate circuit 303, and the voltage value of the first direct current voltage is less than a difference between a low-level decision threshold of the logic gate circuit 303 and a low-level voltage value of the first clock signal.

The second clock source 302 is configured to generate a third clock signal, where an absolute value of a difference between a frequency of the third clock signal and a frequency of the second clock signal is less than a first preset value.

The logic gate circuit 303 is configured to perform an AND logical operation on the second clock signal and the third clock signal to generate a fourth clock signal.

For example, the first oscillation circuit 304 may include a crystal oscillator ("crystal oscillator" for short), a silicon-based micro-electro-mechanical system (Micro-Electro-Mechanical System, MEMS), or an inductor-capacitor oscillator.

For example, the second clock source 302 may include a crystal oscillator, a silicon-based micro-electro-mechanical system (Micro-Electro-Mechanical System, MEMS), or an inductor-capacitor oscillator.

It should be noted that the absolute value of the difference between the frequency of the third clock signal and the frequency of the second clock signal is less than the first preset value refers to that the frequency of the third clock signal and the frequency of the second clock signal are approximately the same. For example, in a relatively large observation time window, the frequencies of the third clock signal and the second clock signal are the same. For example, if the first preset value is 1‰, a frequency difference between the frequency of the third clock signal and the frequency of the second clock signal at any moment of time does not exceed 1‰. The specific first preset value may be determined according to precision required by the clock generation circuit 300.

For example, in the first direct current bias circuit 305, a function of removing the direct current component from the first clock signal may be implemented using a capacitor. One end of the capacitor is connected to the first oscillation circuit 304, and the other end is connected to a module of the first direct current bias circuit 305, which implements superpositioning (or superimpositioning) of the first direct current voltage.

For example, the logic gate circuit 303 may be implemented using software or hardware. For example, an implementation of the logic gate circuit 303 includes, but is not limited to, a field programmable gate array (field-programmable gate array, FPGA), an application-specific integrated circuit (application-specific integrated circuit, ASIC), or a central processing unit (central processing unit, CPU).

The first clock source 301 is configured to generate the second clock signal.

The first direct current bias circuit 305 is configured to: remove the direct current component from the first clock signal, and superimpose the first direct current voltage on the first clock signal obtained after the direct current component is removed, to generate the second clock signal.

If the first oscillation circuit 304 normally generates the first clock signal, the first clock signal obtained after the direct current component is removed may be approximately a rectangular wave of alternated high levels and low levels. Because the direct current component is approximately equal to zero, a high-level voltage value of the first clock signal obtained after the direct current component is removed is a value greater than zero, and a low-level voltage value of the first clock signal obtained after the direct current component is removed is a value less than zero. The second clock signal output by the first direct current bias circuit 305 is a rectangular wave whose frequency is essentially equal to that of the first clock signal, and a voltage value of the second clock signal is a sum of a voltage value of the first clock signal and the voltage value of the first direct current voltage.

If the first oscillation circuit 304 has a failure and stops working, a voltage value output by the first oscillation circuit 304 is a particular direct current voltage value. For example, if the first oscillation circuit 304 stops oscillation when the first clock signal is at a high level, the voltage value that is inputted by the first oscillation circuit 304 into the first direct current bias circuit 305 is always kept at a voltage value when the first clock signal is at the high level. A voltage value output by the first direct current bias circuit 305 is a sum of the voltage value of the first direct current voltage and the high-level voltage value of the first clock signal.

Because the voltage value of the first direct current voltage is greater than the high-level decision threshold of the logic gate circuit 303, and the voltage value of the first direct current voltage is less than the difference between the low-level decision threshold of the logic gate circuit 303 and the low-level voltage value of the second clock signal, when the first oscillation circuit 304 normally works, the logic gate circuit 303 uses a high level of the second clock signal as logic "1" and uses a low level of the second clock signal as logic "0". Certainly, it may be understood by persons skilled in the art that, the high-level decision threshold, the low-level decision threshold, a high-level voltage value of the second clock signal, the low-level voltage value of the second clock signal, the voltage value of the first direct current voltage, and the difference between the low-level decision threshold and the low-level voltage value of the second clock signal each may be a value greater than or equal to 0 or may be a value less than 0.

Therefore, if the first oscillation circuit 304 normally works, when the inputted second clock signal and the inputted third clock signal are both at the high level, the fourth clock signal output by the logic gate circuit 303 is at the high level. When either of the second clock signal and the third clock signal that are inputted into the logic gate circuit 303 is at a low level, the fourth clock signal output by the logic gate circuit 303 is at the low level.

Optionally, a time at which the logic gate circuit 303 receives a rising edge of the second clock signal is earlier than a time at which the logic gate circuit 303 receives a rising edge of the third clock signal, and a difference between the time at which the logic gate circuit 303 receives the rising edge of the second clock signal and the time at which the logic gate circuit 303 receives the rising edge of the third clock signal is less than high-level duration of the second clock signal. Alternatively, a time at which the logic gate circuit 303 receives a rising edge of the second clock signal is later than a time at which the logic gate circuit 303 receives a rising edge of the third clock signal, and a difference between the time at which the logic gate circuit 303 receives the rising edge of the third clock signal and the time at which the logic gate circuit 303 receives the rising edge of the second clock signal is less than high-level duration of the third clock signal. Therefore, a phase of the second clock signal received by the logic gate circuit 303 is synchronized with a phase of the third clock signal received by the logic gate circuit 303.

It should be noted that, the second clock signal and the third clock signal each may be a clock pulse sequence including multiple periods. Therefore, the second clock signal may include multiple rising edges, and for the logic gate circuit 303, there are multiple times for receiving the rising edges of the second clock signal. Likewise, for the logic gate circuit 303, there are also multiple times for receiving rising edges of the third clock signal. Unless otherwise specified in this application, when "a time at which the logic gate circuit receives a rising edge of the second clock signal" and "a time at which the logic gate circuit receives a rising edge of the third clock signal" are mentioned in association with each other, it refers to a first time at which the logic gate circuit 303 receives a particular rising edge of the second clock signal, and a second time of the multiple times at which the logic gate circuit 303 receives the multiple rising edges of the third clock signal. The second time is a time that is the closest to the first time of the multiple times.

For example, if the first time at which the logic gate circuit 303 receives the particular rising edge of the second clock signal is a moment 0, and the multiple times at which the logic gate circuit 303 receives the multiple rising edges of the third clock signal are: a moment −5, a moment −1, a moment 3, and a moment 7, and the second time is the moment −1. For another example, if the first time at which the logic gate circuit 303 receives the particular rising edge of the second clock signal is a moment 0, and the multiple times at which the logic gate circuit 303 receives the multiple rising edges of the third clock signal are: a moment −7, a moment −3, a moment 1, and a moment 5, and the second time is the moment 1.

When the first oscillation circuit 304 stops oscillation, the logic gate circuit 303 uses, the voltage value output by the first direct current bias circuit 305, as logic "1". If the first oscillation circuit 304 stops oscillation, the fourth clock signal output by the logic gate circuit 303 is a result obtained by performing an AND logical operation on the logic "1" and the third clock signal.

By means of the foregoing solution, a dedicated detection circuit does not need to be disposed in the clock generation circuit 300. Regardless of whether the first clock source is working or the first clock source stops working, the clock generation circuit 300 may output a clock signal to meet a requirement that the clock generation circuit 300 does not incur a signal output interruption because the first oscillation circuit 304 in the first clock source 301 stops oscillating.

Figure 4:
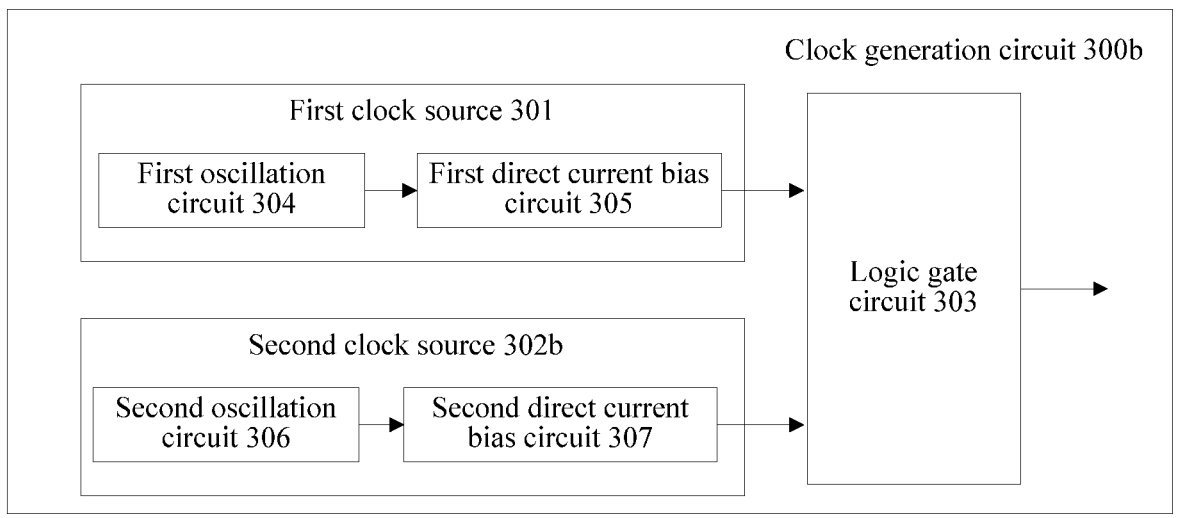
FIG. 4 shows a second clock generation circuit according to an embodiment of this application.

FIG. 4 is a schematic structural diagram of a clock generation circuit 300b. The clock generation circuit 300b shown in FIG. 4 is obtained by extending the clock generation circuit 300 shown in FIG. 3. Specifically, the second clock source 302 shown in FIG. 3 may be extended to obtain a second clock source 302b shown in FIG. 4. The following describes only technical content that is in the solution shown in FIG. 4 and that is different from the technical content in the solution shown in FIG. 3. For same technical content in the solution shown in FIG. 4 and in the solution shown in FIG. 3, details are not described below again.

Specifically, the second clock source 302b shown in FIG. 4 specifically includes a second oscillation circuit 306 and a second direct current bias circuit 307. As shown in FIG. 4, the second oscillation circuit 306 is coupled to the second direct current bias circuit 307, and the second direct current bias circuit 307 is coupled to the logic gate circuit 303.

The second oscillation circuit 306 is configured to generate a fifth clock signal.

The second direct current bias circuit 307 is configured to: remove a direct current component from the fifth clock signal, and superimpose a second direct current voltage on the fifth clock signal obtained after the direct current component is removed, to generate the third clock signal. A voltage value of the second direct current voltage is greater than the high-level decision threshold of the logic gate circuit, and the voltage value of the second direct current voltage is less than a difference between the low-level decision threshold of the logic gate circuit and a low-level voltage value of the fifth clock signal.

For example, a specific implementation of the second direct current bias circuit 307 may be the same as a specific implementation of the first direct current bias circuit 305, and details are not described herein again.

By means of the foregoing solution, regardless of whether the first clock source stops generating a clock signal or the second clock source stops generating a clock signal, the clock generation circuit can continually generate a correct clock signal. This enhances reliability of the clock generation circuit.

Figure 5:
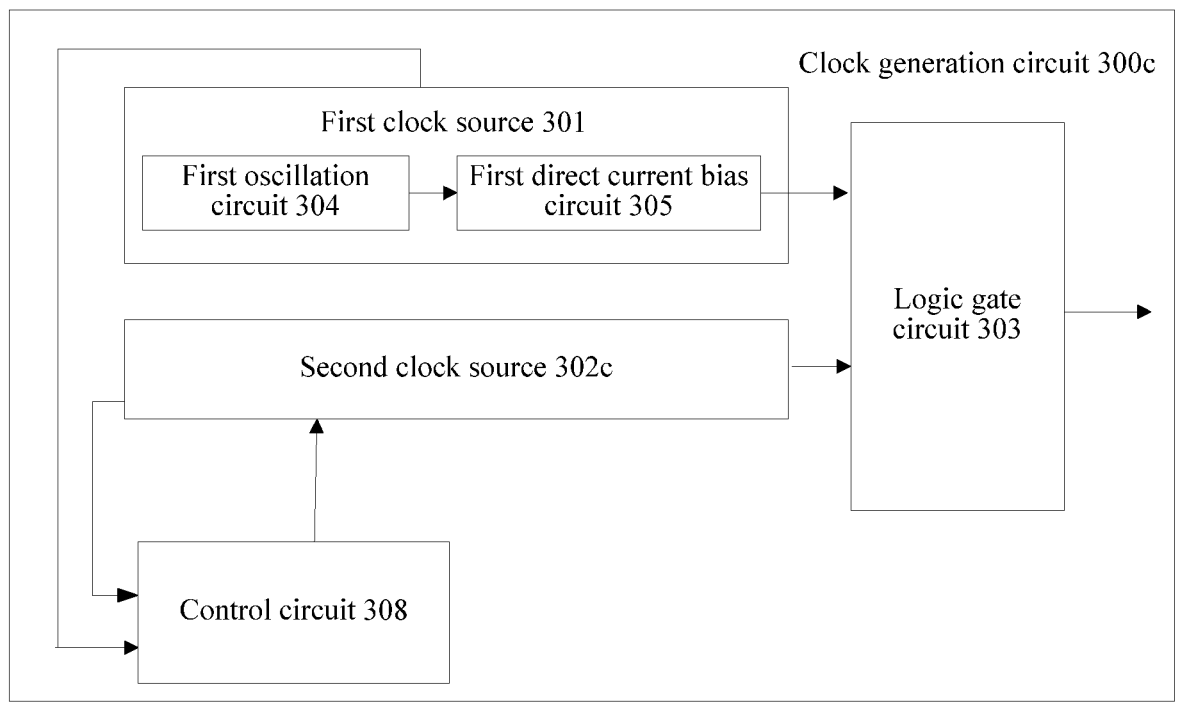
FIG. 5 shows a third clock generation circuit according to an embodiment of this application.

FIG. 5 is a schematic structural diagram of a clock generation circuit 300c. The clock generation circuit 300c shown in FIG. 5 is obtained by extending the clock generation circuit 300 shown in FIG. 3. Specifically, the second clock source 302 shown in FIG. 3 may be extended to obtain a second clock source 302c shown in FIG. 5. The following describes only technical content that is in the solution shown in FIG. 5 and that is different from the technical content in the solution shown in FIG. 3. For same technical content in the solution shown in FIG. 5 and in the solution shown in FIG. 3, details are not described below again.

As shown in FIG. 5, the second clock source 302 may be a controlled clock source, and the clock generation circuit 300c further includes a control circuit 308.

The control circuit 308 is configured to: generate a control signal according to a phase difference and/or a frequency difference between the second clock signal and the third clock signal, and send the control signal to the second clock source 302c.

The control signal is used to control the frequency of the third clock signal, so that the difference between the frequency of the third clock signal and the frequency of the second clock signal is less than the first preset value.

For example, the second clock source 302c can be a controlled clock source as the second clock source 302c can include a controlled oscillation circuit. A specific implementation of the controlled oscillation circuit includes, but is not limited to, a voltage-controlled crystal oscillator, a digital-controlled oscillator (Digital-Controlled Oscillator, DCO), a numerically controlled oscillator (Numerically-Controlled Oscillator, NCO), a direct digital synthesizer (Direct Digital Synthesizer, DDS), and the like.

Specifically, the control circuit 308 is configured to form a negative feedback mechanism according to clock signals output by the first clock source 301 and the second clock source 302c, to adjust the frequency and/or the phase of the third clock signal generated by the second clock source 302c.

In an example, the negative feedback mechanism may be: obtaining the difference between the frequencies of the second clock signal and the third clock signal. When the frequency of the second clock signal is greater than the frequency of the third clock signal, the control signal is configured to increase the frequency of the third clock signal. When the frequency of the third clock signal is greater than the frequency of the second clock signal, the control signal is used to decrease the frequency of the third clock signal. In this way, if the frequency of the second clock signal is greater than that of the third clock signal, the second clock source 302c increases the frequency of the third clock signal according to a control signal used to increase the frequency, until the frequency of the third clock signal is greater than the frequency of the second clock signal. Subsequently, the second clock source 302c further receives a control signal used to decrease the frequency, and decreases the frequency of the third clock signal.

It can be understood by persons skilled in the art that, if the first clock source 301 works normally, frequencies of the first clock signal output by the first oscillation circuit 304 and the second clock signal output by the first direct current bias circuit 305 essentially stay unchanged. Therefore, the frequency of the second clock signal that is obtained by the control circuit 308 may be obtained from an output end of the first direct current bias circuit 305, or may be obtained from an output end of the first oscillation circuit 304, or may be obtained from an output end of another component, which can obtain a signal with the same frequency, in the first clock source 301. Likewise, the frequency of the third clock signal that is obtained by the control circuit 308 may be obtained from an output end of the second clock source 302c or from an output end of a particular component in the second clock source 302c. For example, when an implementation used for the second clock source 302c is the same as that for a second clock source 302b shown in FIG. 4, the frequency of the third clock signal may be obtained from an output end of a second oscillation circuit 306, or may be obtained from the second direct current bias circuit 307.

In another example, the negative feedback mechanism may be: obtaining the phase difference between the second clock signal and the third clock signal. For example, when a phase of the second clock signal lags behind a phase of the third clock signal, the control signal is used to decrease the frequency of the third clock signal, so as to decrease the phase difference between the third clock signal and the second clock signal. When the phase of the second clock signal precedes the phase of the third clock signal, the control signal is used to increase the frequency of the third clock signal, so as to decrease the phase difference between the second clock signal and the third clock signal.

It should be noted that, if no obvious delay exists between the output of the first clock signal by the first oscillation circuit 304, the output of the second clock signal by the first direct current bias circuit 305, and the receiving of the second clock signal by the logic gate circuit 303, a phase that is of the first clock signal or the second clock signal and that is obtained from any one of the foregoing modules may be used by the control circuit 308 as the phase of the second clock signal. Likewise, if no obvious delay exists between the modules of the second clock source, a phase that is of the clock signal and that is obtained from anyone in the second clock source 302c may be used by the control circuit 308 as the phase of the third clock signal. Certainly, if the phases of the two clock signals are obtained from output ends of modules having a similar structure of the first clock source 301 and the second clock source 302c, for example, if the phases of the two clock signals are separately obtained from the output end of the first oscillation circuit 304 and from an output end of the controlled oscillation circuit in the second clock source 302c, a more accurate phase difference may be obtained, so that the frequency of the third clock signal generated by the second clock source 302c can be more accurately controlled.

It should be noted that, when the first oscillation circuit 304 stops oscillation, it is equivalent to that the frequency that is of the second clock signal and that is obtained by the control circuit 308 is always less than the frequency of the third clock signal, or the phase of the second clock signal always lags behind the phase of the third clock signal. Therefore, the control signal that is sent by the control circuit 308 to the second clock source 302c is always a control signal used to decrease the frequency of the third clock signal. Therefore, the frequency of the third clock signal output by the second clock source 302c is gradually reduced under control of the control circuit 308, and finally, may be reduced to a frequency lower limit of a tuning range of the controlled oscillation circuit in the second clock source 302c. The tuning range refers to a range in which a frequency of a clock signal generated by the controlled oscillation circuit under control of the control signal can reach. Therefore, the second clock source 302c, used as the controlled clock source, needs to make the tuning range of the controlled oscillation circuit meet a requirement on clock precision of the clock generation circuit.

For example, if the clock precision of the clock generation circuit requires a frequency of a signal, which is output, to be located between $f_1$ and $f_2$, the frequency of the third clock signal generated by the second clock source 302c under control of the control signal also should not exceed the range of $f_1$ to $f_2$. By setting the tuning range (for example, the tuning range <100 parts per million (part per million, ppm)) of the controlled oscillation circuit, a frequency drift of a clock signal output by the controlled oscillation circuit may not affect output of a clock signal by the clock generation circuit 300. When the tuning range of the controlled oscillation circuit is set, the tuning range may be determined according to a requirement on precision of the fourth clock signal generated by the clock generation circuit 300c. Higher precision of the fourth clock signal indicates a smaller tuning range.

It can be understood by persons skilled in the art that, because each of the second clock signal and the third clock signal is a clock pulse sequence that lasts a period of duration or includes one or more periods, that the control signal is used to control the frequency of the third clock signal specifically refers to that the control circuit 308 obtains the second clock signal and the third clock signal that are generated within the first time period, and generates the control signal according to the frequency difference or the phase difference between the second clock signal and the third clock signal within the first time period; and the control signal is sent back to the second clock source 302c by the control circuit 308. This process takes a time period. Therefore, the control signal is actually used to control the frequency of the third clock signal generated by the second clock source 302c within a second time period. The second time period is later than the first time period. Certainly, if the control signal is a continuous signal, it may be approximately considered that a control signal that is generated by the control circuit according to the frequency difference and/or the phase difference between the second clock signal and the third clock signal at a moment t is used to control the frequency of the third clock signal generated at a moment t+Δt.

Optionally, in an example in which the second clock source 302c is a controlled clock source, the second clock source 302c includes a voltage-controlled crystal oscillator. Because a tuning range of the voltage-controlled crystal oscillator is relatively small, the tuning range of the second clock source 302c can be ensured when no auxiliary circuits are disposed on the second clock source 302c.

For example, when a numerically controlled oscillator included in the second clock source 302c is used as the controlled oscillation circuit, because the numerically controlled oscillator needs a clock signal as a reference, a clock oscillator needs to be configured for the numerically controlled oscillator. If the numerically controlled oscillator is used as the controlled oscillation circuit, the control circuit 308 usually uses a fractional frequency division technology. When the fractional frequency division technology is used, the tuning range of the controlled oscillation circuit is relatively large. Therefore, an extra logical unit is further needed to limit the tuning range of the controlled oscillation circuit.

By means of the negative feedback mechanism of the control circuit 308, not only the frequency difference between the second clock signal and the third clock signal may be controlled to fall within a range of the first preset value, but also the phase difference between the second clock signal and the third clock signal may be made to fall within a range of a second preset value. Because a constant frequency difference between the two clock signals causes a continuous increase in the phase difference between the two clock signals and finally causes a loss of clock ticks, the control circuit 308 may keep the phase difference between the second clock signal and the third clock signal within a specific range using a negative feedback. This avoids the loss of clock ticks due to a small difference between the frequencies of the two clock signals.

Figure 6:
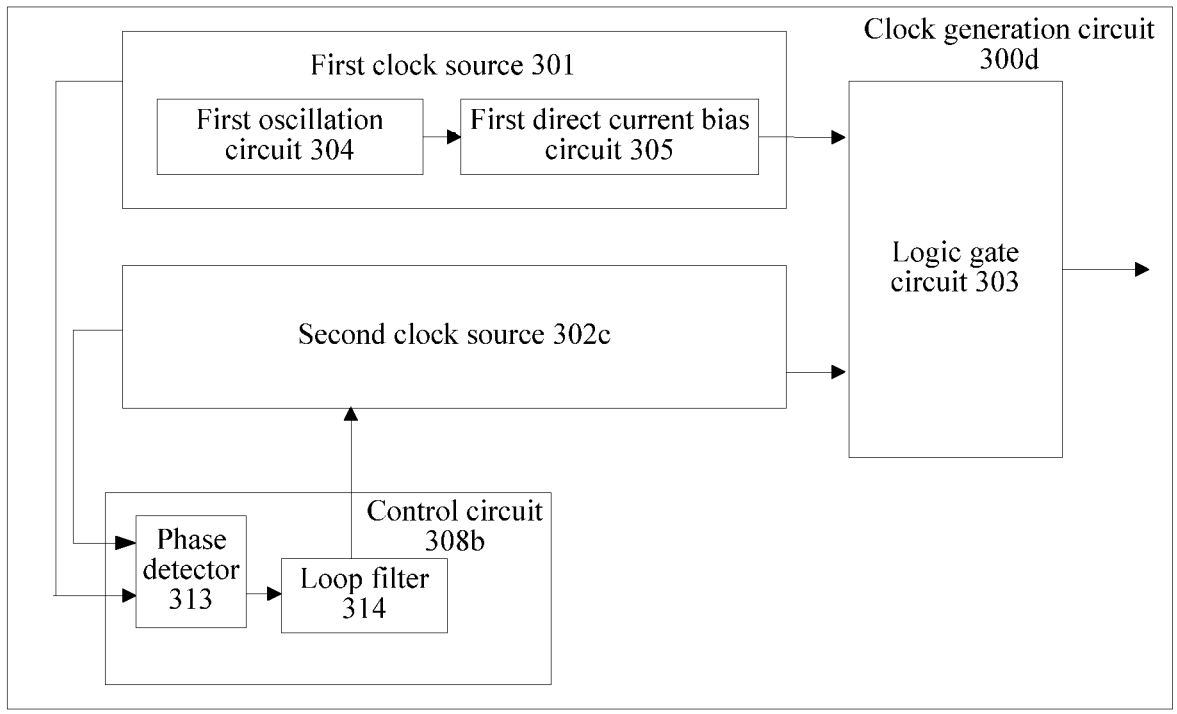
FIG. 6 shows a fourth clock generation circuit according to an embodiment of this application.

The clock generation circuit 300d shown in FIG. 6 is obtained by extending the clock generation circuit 300c shown in FIG. 5. Specifically, the control circuit 308 shown in FIG. 5 may be extended to obtain a control circuit 308b shown in FIG. 6. The following describes only technical content that is in the solution shown in FIG. 6 and that is different from the technical content in the solution shown in FIG. 5. For same technical content in the solution shown in FIG. 6 and in the solution shown in FIG. 5, details are not described below again. The control circuit 308b in FIG. 6 specifically includes a phase detector 313 and a loop filter 314.

For example, the phase detector 313 may include an analog multiplier circuit or a dual D-type flip flop (dual D-type flip flop). The dual D-type flip flop may also be referred to as a dual data flip flop (dual data flip flop). The phase detector 313 is configured to obtain the phase difference and/or the frequency difference between the second clock signal and the third clock signal. The loop filter is configured to filter out a high frequency component from a complex signal generated by the phase detector 313, to obtain a low frequency signal with an almost direct current voltage as the control signal, so as to control the frequency of the third clock signal from the second clock source 302c. Optionally, the phase detector 313 further has a monitoring function and may monitor a phase difference or a frequency difference between inputted signals. When the phase difference or the frequency difference between the inputted signals is excessively large, the phase detector 313 sends an alarm to the clock generation circuit 300d.

For example, when the phase detector 313 uses an analog multiplier circuit, output of the phase detector 313 includes a sum of the frequencies of the second clock signal and the third clock signal and the difference between the frequencies of the second clock signal and the third clock signal. In this embodiment of this application, the difference between the frequencies of the second clock signal and the third clock signal is needed. Therefore, the sum of the frequencies of the second clock signal and the third clock signal may be filtered out using the loop filter 314.

For another example, in an example in which the phase detector 313 includes a dual D-type flip flop, the second clock signal and the third clock signal are used as two input signals of the dual D-type flip flop, and two output signals of the dual D-type flip flop form two periodic rectangular pulses. The control circuit 308b further includes an integration module configured to calculate an area difference between the two rectangular pulses output by the dual D-type flip flop. The control circuit 308b uses the area difference between the rectangular pulses of the two output signals as the control signal, to control the frequency of the third clock signal. For example, when the area difference is greater than zero, it indicates that the phase of the second clock signal precedes the phase of the third clock signal, and the control signal is used to increase the frequency of the third clock signal, so as to decrease the phase difference between the second clock signal and the third clock signal.

Figure 7:
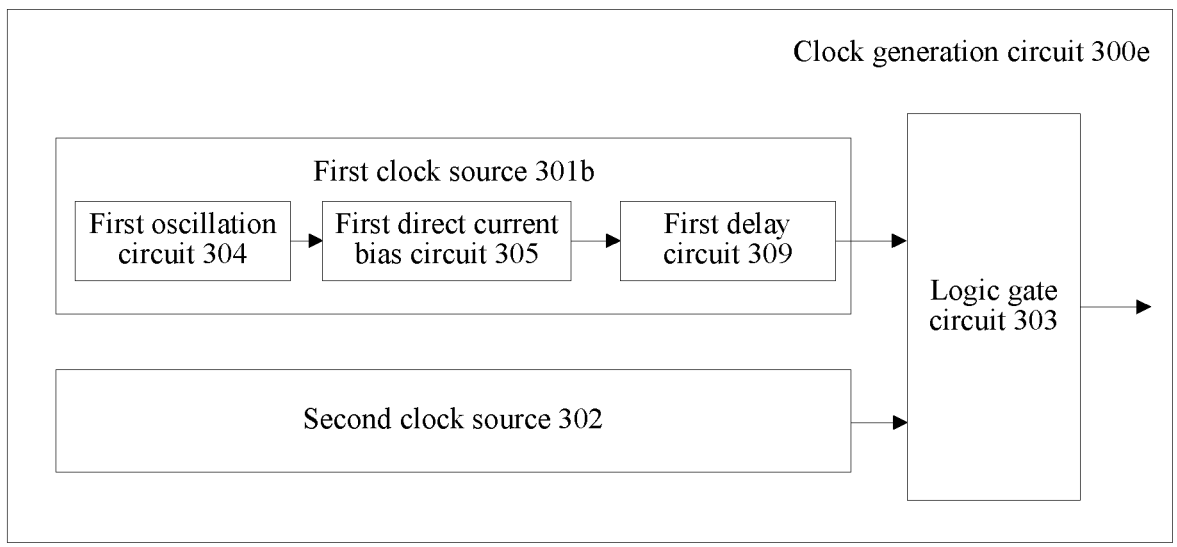
FIG. 7 shows a fifth clock generation circuit according to an embodiment of this application.

FIG. 7 is a schematic structural diagram of a clock generation circuit 300e. The clock generation circuit 300e shown in FIG. 7 is obtained by extending the clock generation circuit 300 shown in FIG. 3. Specifically, the first clock source 301 shown in FIG. 3 may be extended to obtain a first clock source 301b shown in FIG. 7. The following describes only technical content that is in the solution shown in FIG. 7 and that is different from the technical content in the solution shown in FIG. 3. For same technical content in the solution shown in FIG. 7 and in the solution shown in FIG. 3, details are not described below again. In the clock generation circuit 300e, a first delay circuit 309 may be coupled between the first oscillation circuit 304 and the logic gate circuit 303.

The first delay circuit 309 is configured to delay the second clock signal, so that a difference between a time at which the first direct current bias circuit 305 outputs the second clock signal and a time at which the logic gate circuit 303 receives the second clock signal is a first duration; or the first delay circuit 309 is configured to delay the first clock signal, so that a difference between a time at which the first oscillation circuit 304 outputs the first clock signal and a time at which the first direct current bias circuit 305 receives the first clock signal is a second duration.

If the first delay circuit 309 is configured to delay the first clock signal, the first delay circuit 309 may be coupled between the first oscillation circuit 304 and the first direct current bias circuit 305 (this case is not shown in FIG. 7). If the first delay circuit 309 is configured to delay the second clock signal, the first delay circuit 309 may be coupled between the first direct current bias circuit 305 and the logic gate circuit 303. In the two cases, implementations of the first delay circuit 309 and functions of the first delay circuit 309 are the same. Therefore, in FIG. 7, only an example in which the first delay circuit 309 is coupled between the first direct current bias circuit 305 and the logic gate circuit 303 to delay the second clock signal is used.

For example, the phase of the second clock signal output by the first direct current bias circuit 305 is basically synchronized with the phase of the third clock signal output by the second clock source 302. For example, a time of outputting each rising edge is approximately the same. Because the first delay circuit 309 may delay the second clock signal, a time at which the logic gate circuit 303 receives a rising edge of the second clock signal is later than a time at which the logic gate circuit 303 receives a rising edge of the third clock signal. Therefore, a rising edge of a fourth clock signal that is generated by performing an AND logical operation on the delayed second clock signal and the third clock signal is synchronized with the rising edge of the second clock signal.

Figure 8:
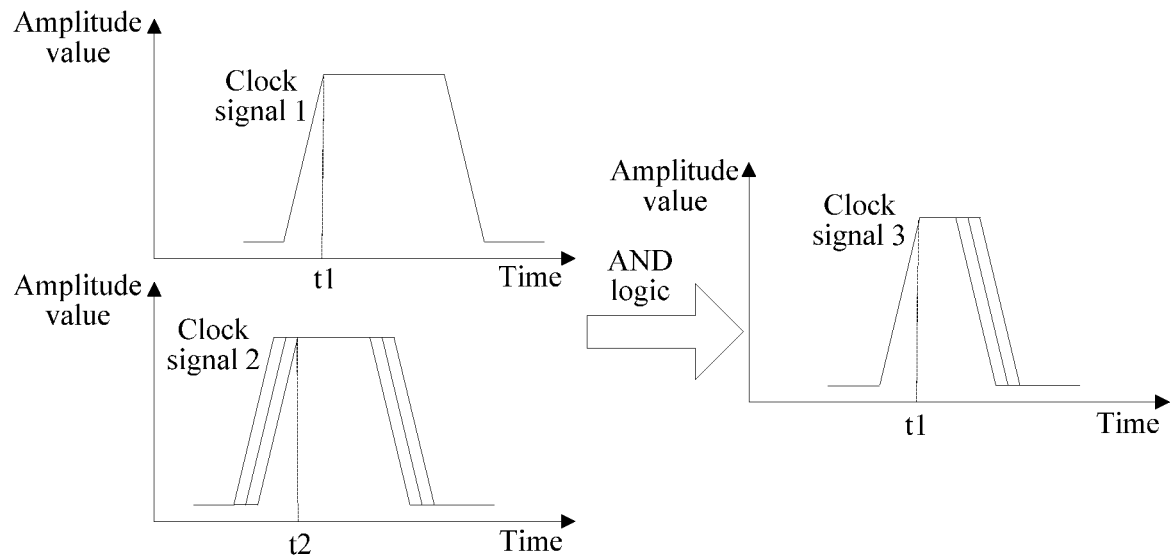
FIG. 8 is a schematic diagram of performing an AND logical operation on a delayed second clock signal and a delayed third clock signal that are in a clock generation circuit.

As shown in FIG. 8, a clock signal 1 is the delayed second clock signal, and a clock signal 2 is the third clock signal. If in a digital circuit, a rising edge of a clock signal is used to trigger a status change, when a phase noise indicator of a rising edge of the first clock signal generated by the first oscillation circuit is relatively desirable (where after the first direct current bias circuit 305 superimposes the first direct current voltage on the first clock signal, the phase noise indicator of the rising edge is not affected, that is, a phase noise indicator of the second clock signal is also relatively desirable), the first delay circuit 309 is coupled between the first oscillation circuit 304 and the logic gate circuit 303. Therefore, after the logic gate circuit 303 performs an AND logical operation on the clock signal 1 and the clock signal 2, a rising edge of a generated clock signal 3 (that is, the fourth clock signal) is a rising edge of the clock signal 1, that is, a rising edge of a clock signal with a relatively desirable phase noise indicator. In actual implementation, the first duration does not necessarily have a relatively large value, because the first delay circuit 309 is mainly disposed to obtain the rising edge of the clock signal 1 (that is, a clock signal with a relatively desirable phase noise indicator).

Figure 9:
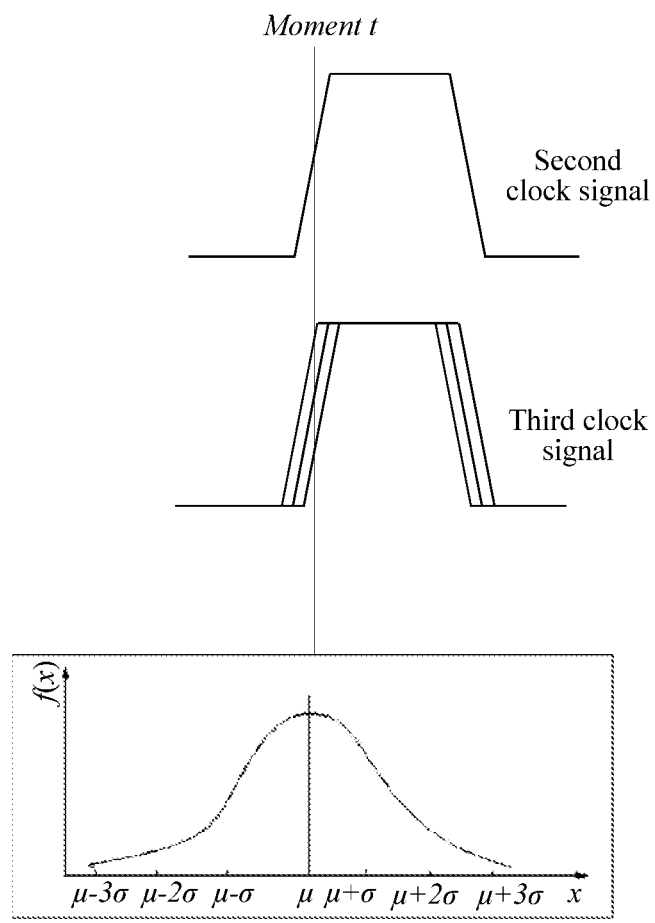
FIG. 9 is a schematic diagram of a phase error between a third clock signal and a second clock signal.

For example, in an implementation in which the second clock source 302 is a second clock source 302c shown in FIG. 5 or FIG. 6, that is, in an implementation in which the second clock source is a controlled clock source, because a frequency of the controlled clock source continually changes under control of the control signal, accuracy of the frequency of the second clock signal generated by the first clock source 301 is higher than that of a second clock signal generated by the second clock source 302c. For example, as shown in FIG. 9, under control of a control circuit 308, phase errors between the third clock signal and the second clock signal meet normal distribution. In this case, it may be considered that a maximum value of a phase error of the third clock signal is 3σ. Therefore, as long as the first duration is greater than 6σ, it can be ensured that each period of the fourth clock signal has a relatively accurate rising edge.

For a method for setting the second duration, refer to a method for setting the first duration. Details are not described herein again.

Therefore, a rising edge of a clock signal output by the clock generation circuit 300e can be selected by coupling the first delay circuit 309 between the first oscillation circuit 304 and the logic gate circuit 303.

In practice, the first delay circuit 309 may be implemented using two serially connected phase inverters.

In addition, it should be noted that, in an example in which an implementation used for the second clock source in the clock generation circuit 300e is the same as that for the second clock source 302c shown in FIG. 5 or FIG. 6, if the control circuit generates the control signal according to the phase difference between the second clock signal and the third clock signal, a more accurate control signal may be obtained if the first delay circuit 309 obtains the phase of the second clock signal before delaying the second clock signal.

Figure 10:
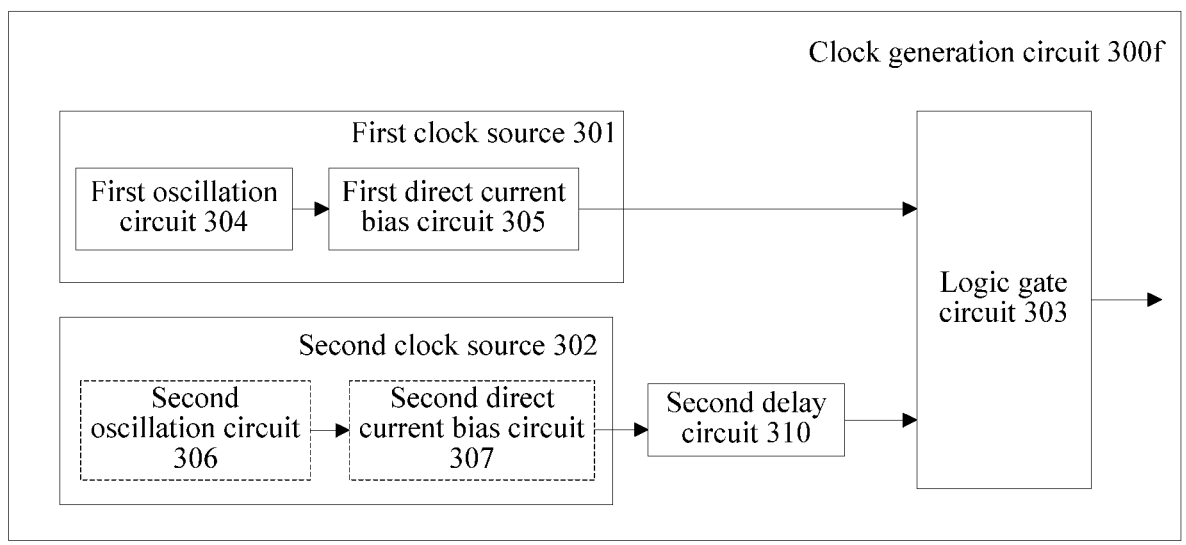
FIG. 10 shows a sixth clock generation circuit according to an embodiment of this application.

A clock generation circuit 300f shown in FIG. 10 is obtained by extending the clock generation circuit 300 shown in FIG. 3. The following describes only technical content that is in the solution shown in FIG. 10 and that is different from the technical content in the solution shown in FIG. 3. For the same technical content in the solution shown in FIG. 10 and in the solution shown in FIG. 3, details are not described below again. As shown in FIG. 10, in the clock generation circuit 300f, a second delay circuit 310 may be coupled between the second clock source 302 and the logic gate circuit 303.

The second delay circuit 310 is configured to delay the third clock signal, so that a difference between a time at which the second clock source 302 outputs the third clock signal and a time at which the logic gate circuit 303 receives the third clock signal is a first duration.

Optionally, in an implementation in which the second clock source 302 is a second clock source 302b shown in FIG. 4, that is, in an example in which the second clock source 302 includes a second oscillation circuit 306 and a second direct current bias circuit 307, the second delay circuit 310 may be coupled between the second oscillation circuit 306 and the second direct current bias circuit 307 (this case is not shown in FIG. 10) to delay a fifth clock signal, so that a difference between a time at which the second oscillation circuit 306 outputs the fifth clock signal and a time at which the second direct current bias circuit 307 receives the fifth clock signal is a second duration. Alternatively, the second delay circuit 310 may be coupled between the second direct current bias circuit 307 and the logic gate circuit 303 to delay the third clock signal, so that a difference between a time at which the second direct current bias circuit 307 outputs the third clock signal and a time at which the logic gate circuit 303 receives the third clock signal is the first duration.

A function of the second delay circuit 310 is similar to that of a first delay circuit 309 shown in FIG. 7, and details are not described herein again. A difference lies in that, still using an example in which accuracy of the second clock signal is higher than that of the third clock signal, if in a system in which the clock generation circuit 300f is located, a falling edge of a clock signal is used to trigger a status change, the second delay circuit 310 may make the fourth clock signal generated by the logic gate circuit 303 have a more accurate falling edge.

In practice, the second delay circuit 310 may be implemented using two serially connected phase inverters.

Optionally, the first delay circuit 309 and the second delay circuit 310 may be both coupled in the clock generation circuit 300. In this way, in view of a phase error between the third clock signal and the second clock signal, if a rising edge of one clock signal is to be selected as a rising edge of a clock signal output by the clock generation circuit 300, a delay time of a delay circuit that corresponds to the clock signal may be set to be relatively long, even if the rising edge of the selected clock signal appears relatively late.

Figure 11:
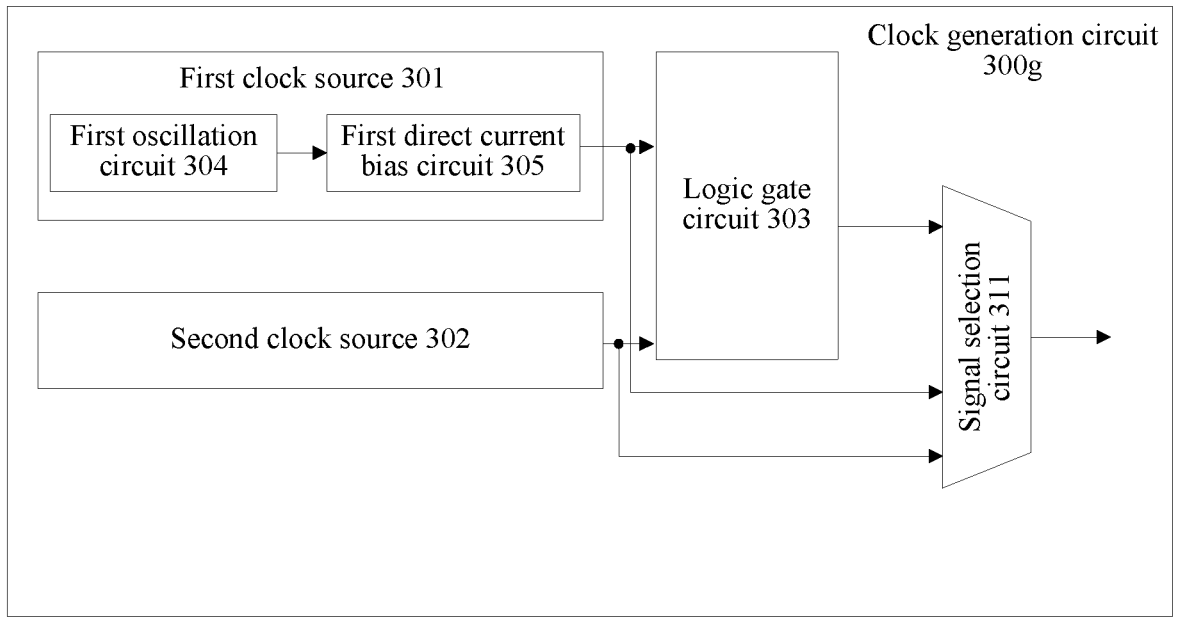
FIG. 11 shows a seventh clock generation circuit according to an embodiment of this application.

A clock generation circuit 300g shown in FIG. 11 is obtained by extending the clock generation circuit 300 shown in FIG. 3. Specifically, a signal selection circuit 311 may be added to the clock generation circuit 300 shown in FIG. 3, to obtain the clock generation circuit 300g shown in FIG. 11. The following describes only technical content that is in the solution shown in FIG. 11 and that is different from the technical content in the solution shown in FIG. 3. For same technical content in the solution shown in FIG. 11 and in the solution shown in FIG. 3, details are not described below again.

The clock generation circuit 300g may further include the signal selection circuit 311. As shown in FIG. 11, the signal selection circuit 311 is coupled to the first clock source 301 and the second clock source 302, and is configured to: when a frequency difference between the second clock signal and the third clock signal exceeds a preset frequency difference threshold, disconnect an input end of the logic gate circuit 303 and directly select one clock signal from the second clock signal or the third clock signal as a clock signal output by the clock generation circuit 300g.

For example, if a clock source loses a clock signal in both two consecutive clock periods, it may also be considered that the clock signal output by the clock source exceeds the preset frequency difference threshold. In this case, the input end of the logic gate circuit 303 would be disconnected, and one clock signal is selected from the second clock signal or the third clock signal as the clock signal output by the clock generation circuit 300g.

The signal selection circuit 311 is configured to resolve a problem that the difference between the frequencies of the clock signals that are output by the first clock source 301 and the second clock source 302 is excessively large. After an AND logical operation is performed on the two clock signals whose frequency difference is relatively large, a high level may not be generated in some clock signal periods, duty cycles of a clock signal output by the logic gate circuit 303 may also be different in different clock periods, and further, the fourth clock signal output by the clock generation circuit becomes disordered.

The signal selection circuit 311 may use a conventional logical tick solution. When the frequency difference between the second clock signal and the third clock signal is relatively large, one stable clock signal is selected from the second clock signal or the third clock signal as the clock signal output by the clock generation circuit 300g. For example, the signal selection circuit 311 may select the first received clock signal as the clock signal output by the clock generation circuit 300g.

Figure 12:
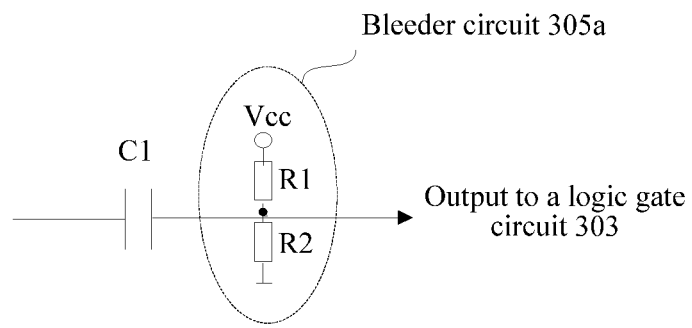
FIG. 12 shows an eighth clock generation circuit according to an embodiment of this application.

FIG. 12 shows a schematic diagram of a possible structure of the first direct current bias circuit 305 in the clock generation circuit 300 shown in FIG. 3. As shown in FIG. 12, a function of removing a direct current component from the first direct current bias circuit 305 may be implemented using a capacitor C1. A function of superimposing a first direct current voltage may be implemented using a bleeder circuit 305a. R1 is connected to a first direct current power supply Vcc, and R2 is connected to a reference ground. A signal output by the bleeder circuit 305a is superimposed on the first clock signal obtained after the direct current component is removed, that is, the first direct current voltage is R1Vcc/(R1+R2). A signal obtained after the superimposing is inputted into a logic gate circuit 303.

In the bleeder circuit 305a, values of R1, R2, and Vcc meet a requirement of the first direct current voltage.

Figure 13:
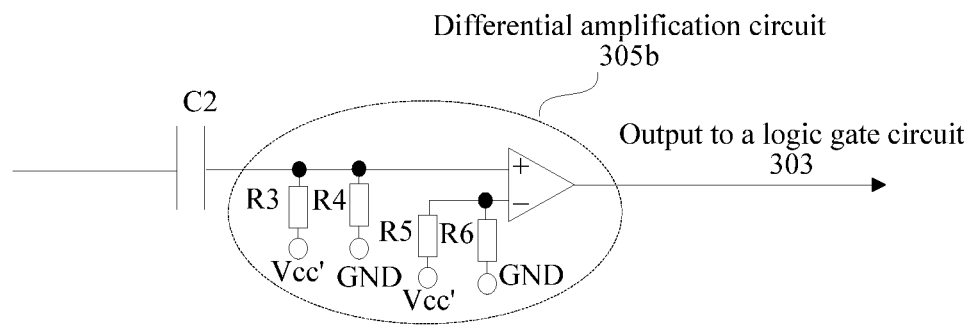
FIG. 13 shows a ninth clock generation circuit according to an embodiment of this application.

FIG. 13 shows a schematic diagram of another possible structure of the first direct current bias circuit 305 in the clock generation circuit 300 shown in FIG. 3. In the first direct current bias circuit 305, a function of superimposing a first direct current voltage may be implemented using a differential amplification circuit 305b. As shown in FIG. 13, a non-inverting input end of an operational amplifier in the differential amplification circuit 305b is connected to a capacitor C2 (which is configured to remove a direct current component from a first clock signal), is connected to a second direct current power supply Vcc' using a resistor R3, and is connected to a reference ground using a resistor R4.

An inverting input end of the operational amplifier is connected to the second direct current power supply Vcc' using a resistor R5, and is connected to the reference ground using a resistor R6.

An output end of the operational amplifier is connected to the logic gate circuit 303.

A resistance of the resistor R4 is greater than a resistance of the resistor R6.

Setting resistances of the resistors in an operational amplification circuit and setting a voltage value of the second direct current power supply need to meet a requirement of the first direct current voltage.

In addition, the clock generation circuit 300 shown in FIG. 3 may be extended, and the extended clock generation circuit 300 may further include an output phase-locked loop (Phase Lock Loop, PLL) circuit. The output phase-locked loop circuit is coupled to an output end of the logic gate circuit 303, and is configured to: perform frequency synthesis and further output clock signals having different frequencies. In addition, the output phase-locked loop circuit may further filter out a high frequency part in phase noise introduced by a clock source. The output phase-locked loop may be a pure analog clock phase-locked loop with a bandwidth of 50 k to 1 M Hz.

The output phase-locked loop circuit may be a common frequency synthesizer.

In addition, the output phase-locked loop circuit may further modulate a duty cycle of a fourth clock signal output by the logic gate circuit 303, to generate a standard clock signal whose duty cycle is 1:1.

Figure 14:
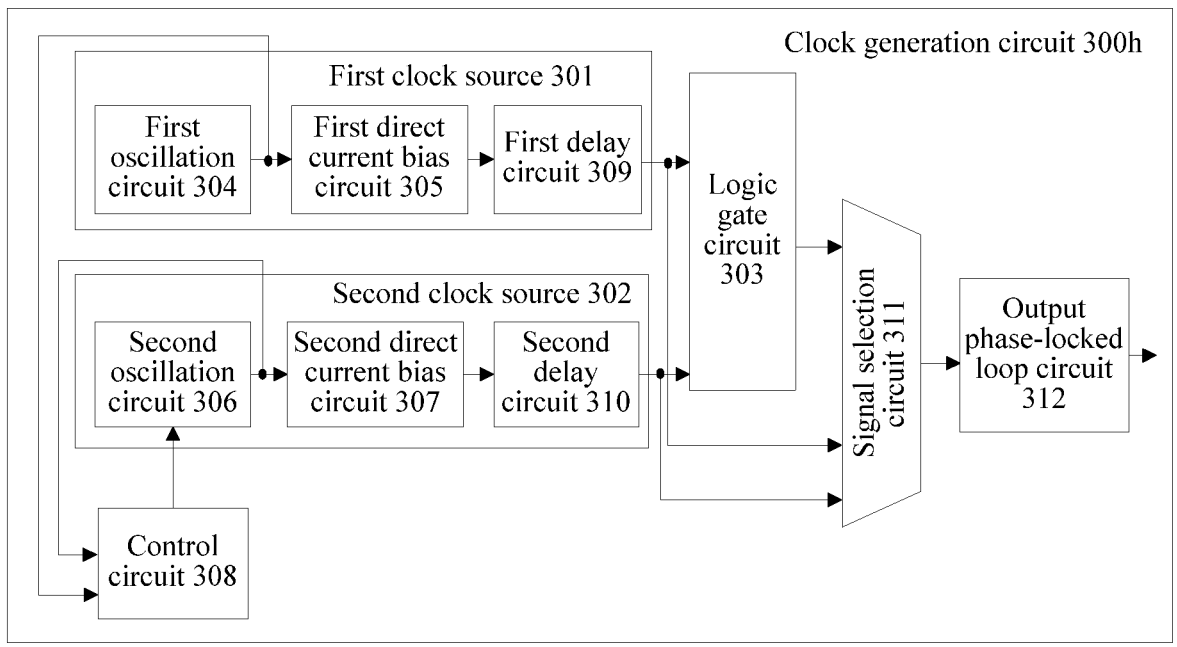
FIG. 14 shows a tenth clock generation circuit according to an embodiment of this application.

Optionally, as shown in FIG. 14, the clock generation circuit 300h may further use the foregoing extension solution. For example, a second clock source 302 includes the second oscillation circuit 306 and the second direct current bias circuit 307 that are described in FIG. 4. The clock generation circuit 300h may further include the control circuit 308 shown in FIG. 5, the first delay circuit 309 shown in FIG. 7, the second delay circuit 310 shown in FIG. 10, and the signal selection circuit 311 shown in FIG. 11. The clock generation circuit 300h may further include an output phase-locked loop circuit 312. Specific implementations and functions of the foregoing structures are the same as the descriptions in the corresponding accompanying drawings.

As shown in FIG. 14, the first direct current bias circuit 305 superimposes a first direct current voltage on a first clock signal generated by the first oscillation circuit 304, to generate a second clock signal. The second clock signal is delayed by the first delay circuit 309 and is sent to an input end of the logic gate circuit 303. The second direct current bias circuit 307 superimposes a second direct current voltage on a fifth clock signal generated by the second oscillation circuit 306, to generate a third clock signal. The third clock signal is delayed by the second delay circuit 310 and is sent to the input end of the logic gate circuit 303. After performing an AND logical operation on the two inputted clock signals, the logic gate circuit 303 outputs, using the output phase-locked loop circuit 312, clock signals that have different frequencies and whose duty cycles are 1:1, and uses the clock signals as clock signals output by the clock generation circuit 300h.

In addition, the clock generation circuit 300h shown in FIG. 14 further includes a signal selection circuit 311, configured to: when a frequency difference between the second clock signal and the third clock signal exceeds a preset frequency difference threshold, directly select one clock signal from the second clock signal or the third clock signal as the clock signal output by the clock generation circuit 300h.

Figure 15:
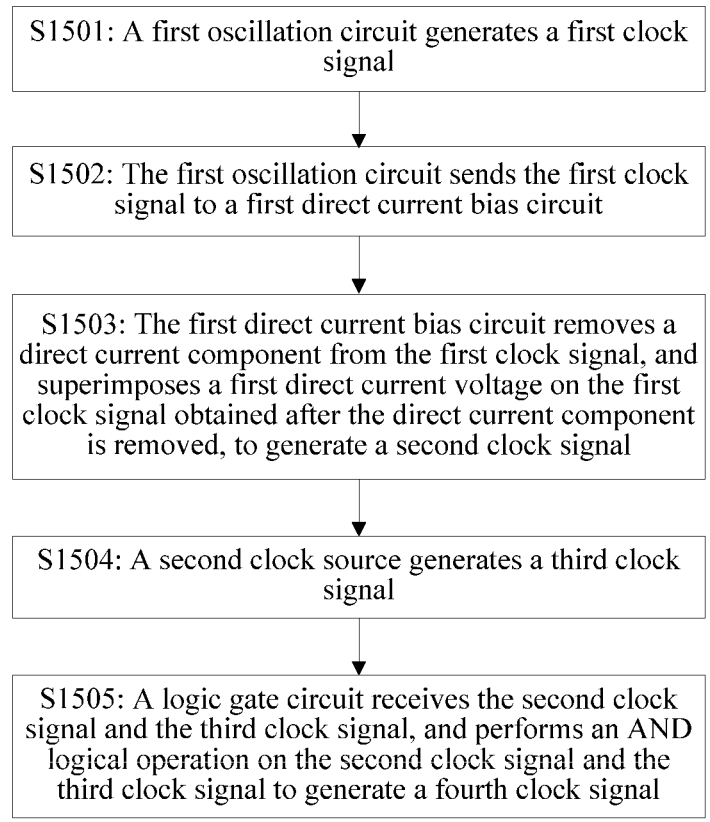
FIG. 15 is a flowchart of a first clock generation method according to an embodiment of this application.

An embodiment of this application provides a clock signal generation method. The method is applied to a clock generation circuit, the clock generation circuit includes a first clock source, a second clock source, and a logic gate circuit, and the first clock source includes a first oscillation circuit and a first direct current bias circuit. As shown in FIG. 15, the method includes the following operations.

Operation S1501: The first oscillation circuit generates a first clock signal.

Operation S1502: The first oscillation circuit sends the first clock signal to the first direct current bias circuit.

Operation S1503: The first direct current bias circuit removes a direct current component from the first clock signal, and superimposes a first direct current voltage on the first clock signal obtained after the direct current component is removed, to generate a second clock signal.

A voltage value of the first direct current voltage is greater than a high-level decision threshold of the logic gate circuit, and the voltage value of the first direct current voltage is less than a difference between a low-level decision threshold of the logic gate circuit and a low-level voltage value of the second clock signal.

Operation S1504: The second clock source generates a third clock signal.

A difference between frequencies of the third clock signal and the second clock signal is less than a first preset value.

Operation S1505: The logic gate circuit receives the second clock signal and the third clock signal, and performs an AND logical operation on the second clock signal and the third clock signal to generate a fourth clock signal.

Optionally, the second clock source includes a second oscillation circuit and a second direct current bias circuit; and the generating, by the second clock source, a third clock signal specifically includes:

generating, by the second oscillation circuit, a fifth clock signal; and sending, by the second oscillation circuit, the fifth clock signal to the second direct current bias circuit; and removing, by the second direct current bias circuit, a direct current component from the fifth clock signal, and superimposing a second direct current voltage on the fifth clock signal obtained after the direct current component is removed, to generate the third clock signal, where a voltage value of the second direct current voltage is greater than the high-level decision threshold of the logic gate circuit, and the voltage value of the second direct current voltage is less than a difference between the low-level decision threshold of the logic gate circuit and a low-level voltage value of the fifth clock signal.

Optionally, the second clock source is a controlled clock source, and the clock generation circuit further includes a control circuit. The method further includes:

generating, by the control circuit, a control signal according to a phase difference and/or a frequency difference between the second clock signal and the third clock signal, and sending the control signal to the second clock source; and the control signal is used to control a frequency of the third clock signal, so that an absolute value of the difference between the frequency of the third clock signal and a frequency of the second clock signal is less than the first preset value.

Optionally, the clock generation circuit further includes a first delay circuit, and the method further includes:

delaying, by the first delay circuit, the second clock signal, so that a difference between a time at which the first direct current bias circuit outputs the second clock signal and a time at which the logic gate circuit receives the second clock signal is first duration; or delaying, by the first delay circuit, the first clock signal, so that a difference between a time at which the first oscillation circuit outputs the first clock signal and a time at which the first direct current bias circuit receives the first clock signal is second duration.

Optionally, the clock generation circuit further includes a second delay circuit, and the method further includes:

delaying, by the second delay circuit, the third clock signal, so that a difference between a time at which the second clock source outputs the third clock signal and a time at which the logic gate circuit receives the third clock signal is first duration.

Optionally, the clock generation circuit further includes a second delay circuit, and the method further includes:

delaying, by the second delay circuit, the third clock signal, so that a difference between a time at which the second direct current bias circuit outputs the third clock signal and a time at which the logic gate circuit receives the third clock signal is a first duration; or delaying, by the second delay circuit, the fifth clock signal, so that a difference between a time at which the second oscillation circuit outputs the fifth clock signal and a time at which the second direct current bias circuit receives the fifth clock signal is a second duration.

Optionally, a time at which the logic gate circuit receives a rising edge of the second clock signal is earlier than a time at which the logic gate circuit receives a rising edge of the third clock signal, and a difference between the time at which the logic gate circuit receives the rising edge of the second clock signal and the time at which the logic gate circuit receives the rising edge of the third clock signal is less than a high-level duration of the second clock signal. Alternatively, a time at which the logic gate circuit receives a rising edge of the second clock signal is later than a time at which the logic gate circuit receives a rising edge of the third clock signal, and a difference between the time at which the logic gate circuit receives the rising edge of the third clock signal and the time at which the logic gate circuit receives the rising edge of the second clock signal is less than a high-level duration of the third clock signal.

The clock signal generation method shown in FIG. 15 may be implemented using the foregoing clock generation circuit 300 and the extension solutions of the clock generation circuit 300. For content that is not described in detail in the method shown in FIG. 15, refer to corresponding descriptions of the clock generation circuit 300 and the extension solutions of the clock generation circuit 300.

Figure 16:
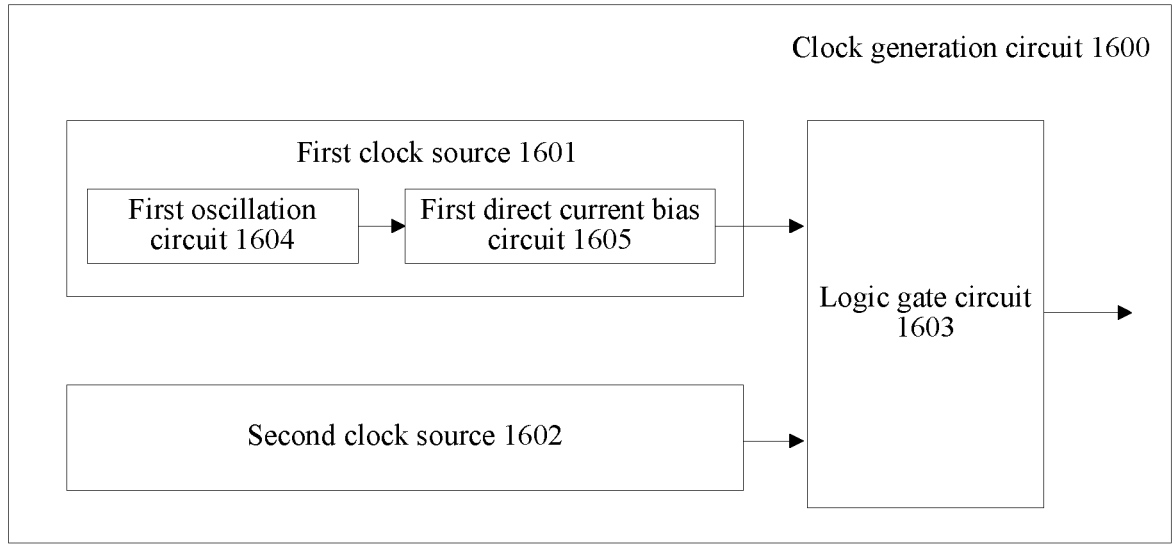
FIG. 16 shows an eleventh clock generation circuit according to an embodiment of this application.

As shown in FIG. 16, the clock generation circuit 1600 includes a first clock source 1601, a second clock source 1602, and a logic gate circuit 1603. The first clock source 1601 is coupled to the logic gate circuit 1603, and the second clock source 1602 is coupled to the logic gate circuit 1603.

The first clock source 1601 includes a first oscillation circuit 1604 and a first direct current bias circuit 1605, the first oscillation circuit 1604 is coupled to the first direct current bias circuit 1605, and the first direct current bias circuit 1605 is coupled to the logic gate circuit 1603.

The first oscillation circuit 1604 is configured to generate a first clock signal.

The first direct current bias circuit 1605 is configured to: remove a direct current component from the first clock signal, and superimpose a first direct current voltage on the first clock signal obtained after the direct current component is removed, to generate a second clock signal. A voltage value of the first direct current voltage is less than a low-level decision threshold of the logic gate circuit 1603, and is greater than a difference between a high-level decision threshold of the logic gate circuit 1603 and a high-level voltage value of the second clock signal.

The second clock source 1602 is configured to generate a third clock signal, where an absolute value of a difference between a frequency of the third clock signal and a frequency of the second clock signal is less than a first preset value.

The logic gate circuit 1603 is configured to perform an OR logical operation on the second clock signal and the third clock signal to generate a fourth clock signal.

For example, the first oscillation circuit 1604 may include a crystal oscillator ("crystal oscillator" for short), a silicon-based micro-electro-mechanical system (Micro-Electro-Mechanical System, MEMS), or an inductor-capacitor oscillator.

For example, the second clock source 1602 may include a crystal oscillator, a silicon-based micro-electro-mechanical system (Micro-Electro-Mechanical System, MEMS), or an inductor-capacitor oscillator. It should be noted that, that the absolute value of the difference between the frequency of the third clock signal and the frequency of the second clock signal is less than the first preset value refers to that the frequency of the third clock signal and the frequency of the second clock signal are essentially the same. For example, in a relatively large observation time window, the frequencies of the third clock signal and the second clock signal are the same. For example, if the first preset value is 1‰, a frequency difference between the frequency of the third clock signal and the frequency of the second clock signal at any moment does not exceed 1‰. The specific magnitude of the first preset value may be determined according to precision required by the clock generation circuit 1600.

For example, in the first direct current bias circuit 1605, a function of removing the direct current component from the first clock signal may be implemented using a capacitor. One end of the capacitor is connected to the first oscillation circuit 1604, and the other end is connected to a module, which implements superimposing of the first direct current voltage, in the first direct current bias circuit 1605.

For example, the logic gate circuit 1603 may be implemented using software or hardware. During implementation using hardware, a specific implementation is not limited to a basic logic gate circuit: an OR gate, as long as the circuit can implement bitwise OR on multiple signals. For example, an implementation of the logic gate circuit 1603 includes, but is not limited to, a field programmable gate array (field-programmable gate array, FPGA), an application-specific integrated circuit (application-specific integrated circuit, ASIC), or a central processing unit (central processing unit, CPU).

The first direct current bias circuit 1605 is configured to: remove the direct current component from the first clock signal, and superimpose the first direct current voltage on the first clock signal obtained after the direct current component is removed, to generate the second clock signal.

If the first oscillation circuit 1604 normally generates the first clock signal, the first clock signal obtained after the direct current component is removed may be approximately a rectangular wave of alternated high levels and low levels. Because the direct current component is zero, a high-level voltage value of the first clock signal obtained after the direct current component is removed is a value greater than zero, and a low-level voltage value of the first clock signal obtained after the direct current component is removed is a value less than zero. The second clock signal output by the first direct current bias circuit 1605 is a rectangular wave whose frequency is essentially equal to that of the first clock signal, and a voltage value of the second clock signal is a sum of a voltage value of the first clock signal and the voltage value of the first direct current voltage.

If the first oscillation circuit 1604 fails and stops working, a voltage value output by the first oscillation circuit 1604 is a particular direct current voltage value. For example, if the first oscillation circuit 1604 stops oscillation when the first clock signal is at a high level, the voltage value that is inputted by the first oscillation circuit 1604 into the first direct current bias circuit 1605 is kept at a voltage value when the first clock signal is at the high level. A voltage value output by the first direct current bias circuit 1605 is a sum of the voltage value of the first direct current voltage and the high-level voltage value of the first clock signal.

Because the voltage value of the first direct current voltage is less than the low-level decision threshold of the logic gate circuit 1603, and the voltage value of the first direct current voltage is greater than the difference between the high-level decision threshold of the logic gate circuit 1603 and the high-level voltage value of the second clock signal, when the first oscillation circuit 1604 normally works, the logic gate circuit 1603 uses a high level of the second clock signal as logic "1" and uses a low level of the second clock signal as logic "0". Certainly, it may be understood by persons skilled in the art that, the high-level decision threshold, the low-level decision threshold, a high-level voltage value of the second clock signal, the low-level voltage value of the second clock signal, the voltage value of the first direct current voltage, and the difference between the high-level decision threshold and the high-level voltage value of the second clock signal each may be a value greater than or equal to 0 or may be a value less than 0.

Therefore, if the first oscillation circuit 1604 normally works, when either of the inputted second clock signal and the inputted third clock signal is at a high level, the fourth clock signal output by the logic gate circuit 1603 is at the high level. When the second clock signal and the third clock signal that are inputted into the logic gate circuit 1603 are both at a low level, the fourth clock signal output by the logic gate circuit 1603 is at the low level.

Optionally, a time at which the logic gate circuit 1603 receives a falling edge of the second clock signal is earlier than a time at which the logic gate circuit 1603 receives a falling edge of the third clock signal, and a difference between the time at which the logic gate circuit 1603 receives the falling edge of the second clock signal and the time at which the logic gate circuit 1603 receives the falling edge of the third clock signal is less than low-level duration of the second clock signal. Alternatively, a time at which the logic gate circuit 1603 receives a falling edge of the second clock signal is later than a time at which the logic gate circuit 1603 receives a falling edge of the third clock signal, and a difference between the time at which the logic gate circuit receives the falling edge of the third clock signal and the time at which the logic gate circuit 1603 receives the falling edge of the second clock signal is less than low-level duration of the third clock signal. Therefore, a phase of the second clock signal received by the logic gate circuit 1603 is essentially synchronized with a phase of the third clock signal received by the logic gate circuit 1603.

It should be noted that, the second clock signal and the third clock signal each may be a clock pulse sequence including multiple periods. Therefore, the second clock signal may include multiple falling edges, and for the logic gate circuit 1603, there are multiple times for receiving the falling edges of the second clock signal. Likewise, for the logic gate circuit 1603, there are also multiple times for receiving falling edges of the third clock signal. Unless otherwise specified in this application, when "a time at which the logic gate circuit receives a falling edge of the second clock signal" and "a time at which the logic gate circuit receives a falling edge of the third clock signal" are mentioned in association with each other, it refers to a first time at which the logic gate circuit 1603 receives a particular falling edge of the second clock signal, and a second time of the multiple times at which the logic gate circuit 1603 receives the multiple falling edges of the third clock signal. The second time is a time that is the closest to the first time of the multiple times.

For example, if the first time at which the logic gate circuit 1603 receives the particular falling edge of the second clock signal is a moment 0, and the multiple times at which the logic gate circuit 1603 receives the multiple falling edges of the third clock signal are separately a moment −5, a moment −1, a moment 3, and a moment 7, the second time is the moment −1. For example, if the first time at which the logic gate circuit 1603 receives the particular falling edge of the second clock signal is a moment 0, and the multiple times at which the logic gate circuit 1603 receives the multiple falling edges of the third clock signal are separately a moment −7, a moment −3, a moment 1, and a moment 5, the second time is the moment 1.

When the first oscillation circuit 1604 stops oscillation, the logic gate circuit 1603 uses, the voltage value output by the first direct current bias circuit 1605, as logic "0". If the first oscillation circuit 1604 stops oscillation, the fourth clock signal output by the logic gate circuit 1603 is a result obtained by performing an OR logical operation on the logic "0" and the third clock signal.

By means of the foregoing solution, a dedicated detection circuit does not need to be disposed in the clock generation circuit 1600. Regardless of whether the first clock source normally works or the first clock source stops working, the clock generation circuit 1600 may output a clock signal meeting a requirement, so that the clock generation circuit 1600 does not incur signal output interruption because the first oscillation circuit 1604 in the first clock source 1601 stops oscillation.

Figure 17:
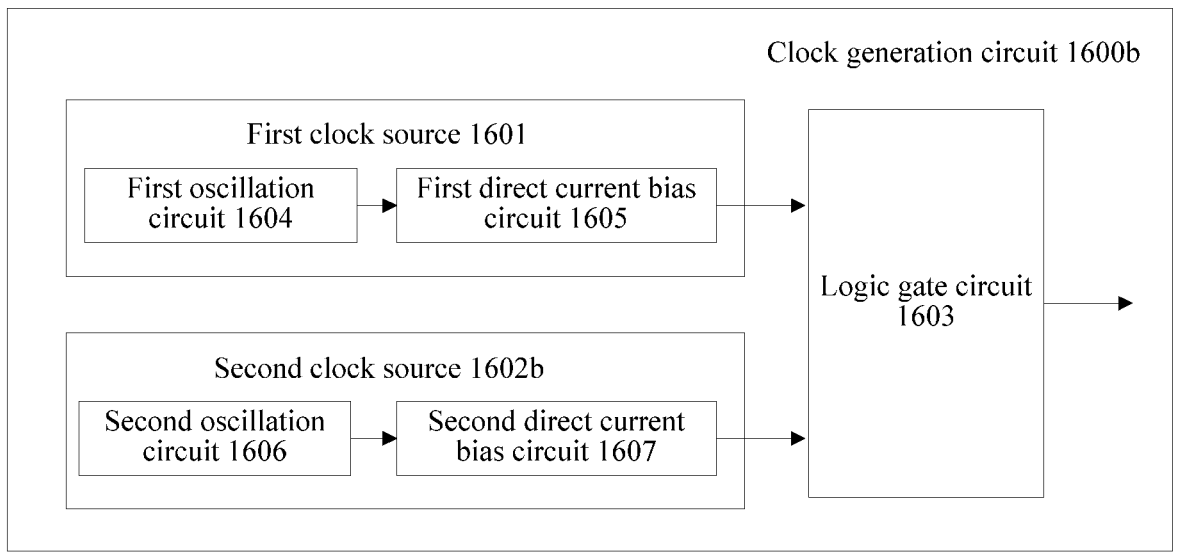
FIG. 17 shows a twelfth clock generation circuit according to an embodiment of this application.

FIG. 17 is a schematic structural diagram of a clock generation circuit 1600*b*. The clock generation circuit 1600*b* shown in FIG. 17 is obtained by extending the clock generation circuit 1600 shown in FIG. 16. Specifically, the second clock source 1602 shown in FIG. 16 may be extended to obtain a second clock source 1602*b* shown in FIG. 17. The following describes only technical content that is in the solution shown in FIG. 17 and that is different from the technical content in the solution shown in FIG. 16. For same technical content in the solution shown in FIG. 17 and in the solution shown in FIG. 16, details are not described below again. In the clock generation circuit 1600*b*, the second clock source 1602*b* may include a second oscillation circuit 1606 and a second direct current bias circuit 1607, the second oscillation circuit 1606 is coupled to the second direct current bias circuit 1607, and the second direct current bias circuit 1607 is coupled to the logic gate circuit 1603.

The second oscillation circuit 1606 is configured to generate a fifth clock signal.

The second direct current bias circuit 1607 is configured to: remove a direct current component from the fifth clock signal, and superimpose a second direct current voltage on the fifth clock signal obtained after the direct current component is removed, to generate the third clock signal, where a voltage value of the second direct current voltage is less than the low-level decision threshold of the logic gate circuit 1603, and is greater than a difference between the high-level decision threshold of the logic gate circuit 1603 and a high-level voltage value of the fifth clock signal.

For example, a specific implementation of the second direct current bias circuit 1607 may be the same as a specific implementation of the first direct current bias circuit 1605, and details are not described herein again.

By means of the foregoing solution, regardless of whether the first clock source stops generating a clock signal or the second clock source stops generating a clock signal, the clock generation circuit can continually generate a correct clock signal. This enhances reliability of the clock generation circuit.

Figure 18:
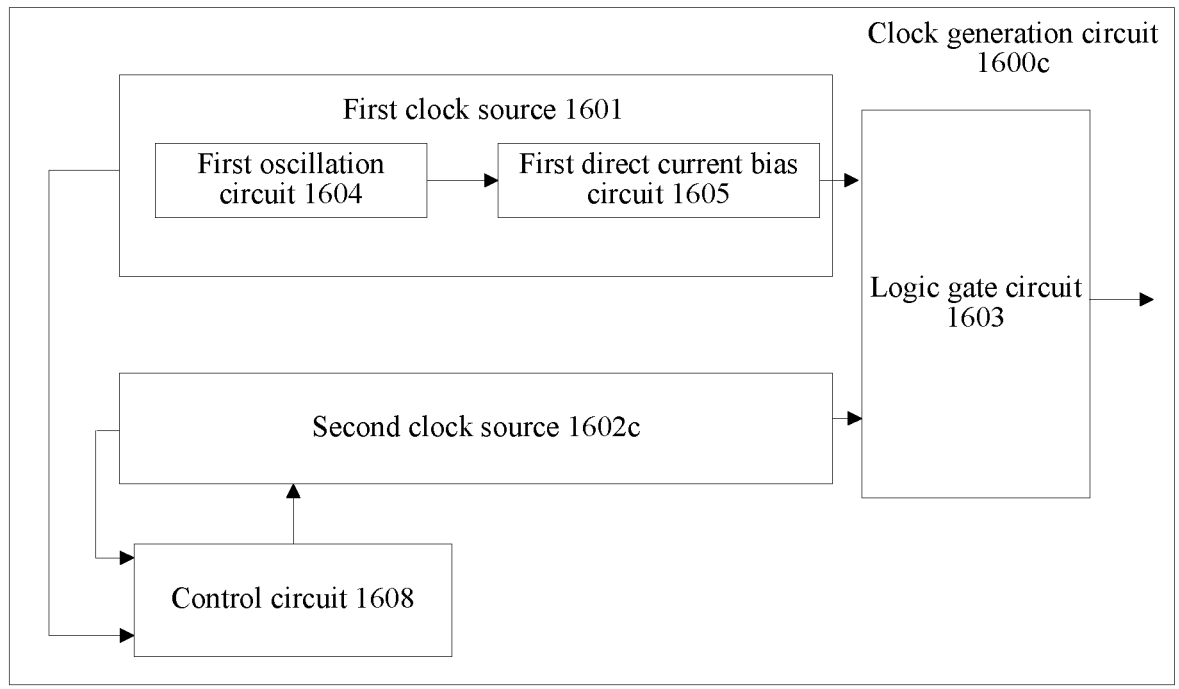
FIG. 18 shows a thirteenth clock generation circuit according to an embodiment of this application.

FIG. 18 is a schematic structural diagram of a clock generation circuit 1600*c*. The clock generation circuit 1600*c* shown in FIG. 18 is obtained by extending the clock generation circuit 1600 shown in FIG. 16. Specifically, the second clock source 1602 shown in FIG. 16 may be extended to obtain a second clock source 1602*c* shown in FIG. 18. The following describes only technical content that is in the solution shown in FIG. 18 and that is different from the technical content in the solution shown in FIG. 16. For same technical content in the solution shown in FIG. 18 and in the solution shown in FIG. 16, details are not described below again. In the clock generation circuit 1600*c*, the second clock source 1602 may be a controlled clock source, and the clock generation circuit 1600*c* further includes a control circuit 1608.

The control circuit 1608 is configured to: generate a control signal according to a phase difference and/or a frequency difference between the second clock signal and the third clock signal, and send the control signal to the second clock source 1602*c*.

The control signal is used to control the frequency of the third clock signal, so that an absolute value of the difference between the frequency of the third clock signal and the frequency of the second clock signal is less than the first preset value.

For example, that the second clock source 1602*c* is a controlled clock source may be that the second clock source 1602*c* includes a controlled oscillation circuit. A specific implementation of the controlled oscillation circuit includes, but is not limited to, a voltage-controlled crystal oscillator, a digital-controlled oscillator (Digital-Controlled Oscillator, DCO), a numerically controlled oscillator (Numerically-Controlled Oscillator, NCO), a direct digital synthesizer (Direct Digital Synthesizer, DDS), and the like.

Specifically, the control circuit 1608 is configured to form a negative feedback mechanism according to clock signals output by the first clock source 1601 and the second clock source 1602c, to adjust the frequency and/or the phase of the third clock signal generated by the second clock source 1602c.

In an example, the negative feedback mechanism may be: obtaining the difference between the frequencies of the second clock signal and the third clock signal. When the frequency of the second clock signal is greater than the frequency of the third clock signal, the control signal is configured to increase the frequency of the third clock signal. When the frequency of the third clock signal is greater than the frequency of the second clock signal, the control signal is used to decrease the frequency of the third clock signal. In this way, if the frequency of the second clock signal is greater than that of the third clock signal, the second clock source 1602c increases the frequency of the third clock signal according to a control signal used to increase the frequency, until the frequency of the third clock signal is greater than the frequency of the second clock signal. Subsequently, the second clock source 1602c further receives a control signal used to decrease the frequency, and decreases the frequency of the third clock signal.

It can be understood by persons skilled in the art that, if the first clock source 1601 works normally, frequencies of the first clock signal output by the first oscillation circuit 1604 and the second clock signal output by the first direct current bias circuit 1605 essentially stay unchanged. Therefore, the frequency of the second clock signal that is obtained by the control circuit 1608 may be obtained from an output end of the first direct current bias circuit 1605, or may be obtained from an output end of the first oscillation circuit 1604, or may be obtained from an output end of another component, which can obtain a signal with the same frequency, in the first clock source 1601. Likewise, the frequency of the third clock signal that is obtained by the control circuit 1608 may be obtained from an output end of the second clock source 1602c or from an output end of a particular component in the second clock source 1602c. For example, when an implementation used for the second clock source 1602c is the same as that for a second clock source 1602b shown in FIG. 17, the frequency of the third clock signal may be obtained from an output end of a second oscillation circuit 1606, or may be obtained from the second direct current bias circuit 1607.

In another example, the negative feedback mechanism may be: obtaining the phase difference between the second clock signal and the third clock signal. For example, when a phase of the second clock signal lags behind a phase of the third clock signal, the control signal is used to decrease the frequency of the third clock signal, so as to decrease the phase difference between the third clock signal and the second clock signal. When the phase of the second clock signal precedes the phase of the third clock signal, the control signal is used to increase the frequency of the third clock signal, so as to decrease the phase difference between the second clock signal and the third clock signal.

It should be noted that, if no obvious delay exists between the output of the first clock signal by the first oscillation circuit 1604, the output of the second clock signal by the first direct current bias circuit 1605, and the receiving of the second clock signal by the logic gate circuit 1603, a phase that is of the first clock signal or the second clock signal and that is obtained from any one of the foregoing modules may be used as the phase of the second clock signal. Likewise, if no obvious delay exists between the modules of the second clock source 1602c, a phase that is of the clock signal and that is obtained from anyone in the second clock source 1602c may be used as the phase of the third clock signal. Certainly, if the phases of the two clock signals are obtained from output ends of modules having a similar structure of the first clock source 1601 and the second clock source 1602c, for example, if the phases of the two clock signals are separately obtained from the output end of the first oscillation circuit 1604 and from an output end of the controlled oscillation circuit in the second clock source 1602c, a more accurate phase difference may be obtained, so that the second clock source 1602c can be more accurately controlled. It should be noted that, when the first oscillation circuit 1604 stops oscillation, it is equivalent to that the frequency that is of the second clock signal and that is obtained by the control circuit 1608 is always less than the frequency of the third clock signal, or the phase of the second clock signal always lags behind the phase of the third clock signal. Therefore, the control signal that is sent by the control circuit 1608 to the second clock source 1602c is always a control signal used to decrease the frequency of the third clock signal. Therefore, the frequency of the third clock signal output by the second clock source 1602c is gradually reduced under control of the control circuit 1608, and finally, may be reduced to a lower limit of a tuning range of the controlled oscillation circuit in the second clock source 1602c. The tuning range refers to a range in which a frequency of a clock signal generated by the controlled oscillation circuit under control of the control signal can reach. Therefore, the second clock source 1602c, used as the controlled clock source, needs to make the tuning range of the controlled oscillation circuit meet a requirement on clock precision of the clock generation circuit 1600.

For example, if the clock precision of the clock generation circuit 1600c requires a frequency of a signal, which is output, to be located between $f_1$ and $f_2$, the frequency of the third clock signal generated by the second clock source 1600c under control of the control signal also should not exceed the range of $f_1$ to $f_2$. By setting the tuning range (for example, the tuning range <100 parts per million (part per million, ppm)) of the controlled oscillation circuit, a frequency drift of a clock signal output by the controlled oscillation circuit may not affect output of a clock signal by the clock generation circuit 1600c. When the tuning range of the controlled oscillation circuit is set, the tuning range may be determined according to a requirement on precision of the fourth clock signal generated by the clock generation circuit 1600c. Higher precision of the fourth clock signal indicates a smaller tuning range.

Optionally, in an example in which the second clock source 1602c is a controlled clock source, the second clock source 1602c includes a voltage-controlled crystal oscillator. Because a tuning range of the voltage-controlled crystal oscillator is relatively small, the tuning range of the second clock source 1602c can be accurately ensured when no excessive auxiliary circuits are disposed.

For example, when a numerically controlled oscillator included in the second clock source 1602c is used as the controlled oscillation circuit, because the numerically controlled oscillator needs a clock signal as a reference, a clock oscillator needs to be configured for the numerically controlled oscillator. If the numerically controlled oscillator is used as the controlled oscillation circuit, the control circuit 1608 usually uses a fractional frequency division technology. When the fractional frequency division technology is used, the tuning range of the controlled oscillation circuit is relatively large. Therefore, an extra logical unit is further needed to limit the tuning range of the controlled oscillation circuit.

By means of the negative feedback mechanism of the control circuit 1608, not only the frequency difference between the second clock signal and the third clock signal may be controlled to fall within a range of the first preset value, but also the phase difference between the second clock signal and the third clock signal may be made to fall within a range of a second preset value. Because a constant frequency difference between the two clock signals causes a continuous increase in the phase difference between the two clock signals and finally causes a loss of clock ticks, the control circuit 1608 may keep the phase difference between the second clock signal and the third clock signal within a specific range using a negative feedback. This avoids the loss of clock ticks caused due to the constant small difference between the frequencies of the two clock signals. For example, the control circuit 1608 may specifically include a phase detector and a loop filter. For implementations of the phase detector and the loop filter, refer to related descriptions in FIG. 6.

Figure 19:
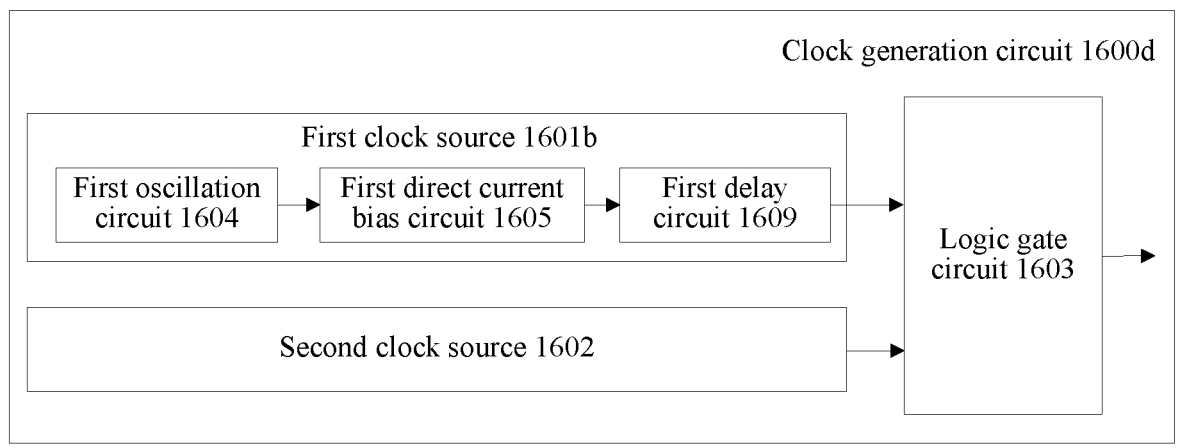
FIG. 19 shows a fourteenth clock generation circuit according to an embodiment of this application.

FIG. 19 is a schematic structural diagram of a clock generation circuit 1600*d*. The clock generation circuit 1600*d* shown in FIG. 19 is obtained by extending the clock generation circuit 1600 shown in FIG. 16. Specifically, the first clock source 1601 shown in FIG. 16 may be extended to obtain a first clock source 1601*b* shown in FIG. 19. The following describes only technical content that is in the solution shown in FIG. 19 and that is different from the technical content in the solution shown in FIG. 16. For same technical content in the solution shown in FIG. 19 and in the solution shown in FIG. 16, details are not described below again. In the clock generation circuit 1600*d*, a first delay circuit 1609 may further be coupled between the first oscillation circuit 1604 and the logic gate circuit 1603.

The first delay circuit 1609 is configured to delay the second clock signal, so that a difference between a time at which the first direct current bias circuit 1605 outputs the second clock signal and a time at which the logic gate circuit 1603 receives the second clock signal is a first duration; or the first delay circuit 1609 is configured to delay the first clock signal, so that a difference between a time at which the first oscillation circuit 1604 outputs the first clock signal and a time at which the first direct current bias circuit 1605 receives the first clock signal is a second duration.

If the first delay circuit 1609 is configured to delay the first clock signal, the first delay circuit 1609 may be coupled between the first oscillation circuit 1604 and the first direct current bias circuit 1605 (this case is not shown in FIG. 19). If the first delay circuit 1609 is configured to delay the second clock signal, the first delay circuit 1609 may be coupled between the first direct current bias circuit 1605 and the logic gate circuit 1603. In the two cases, implementations of the first delay circuit 1609 and functions of the first delay circuit 1609 are the same. Therefore, in FIG. 19, only an example in which the first delay circuit 1609 is coupled between the first direct current bias circuit 1605 and the logic gate circuit 1603 to delay the second clock signal is used.

In practice, the first delay circuit 1609 may be implemented using two serially connected phase inverters.

For a specific implementation of the first delay circuit 1609, refer to the related description in FIG. 8.

Figure 20:
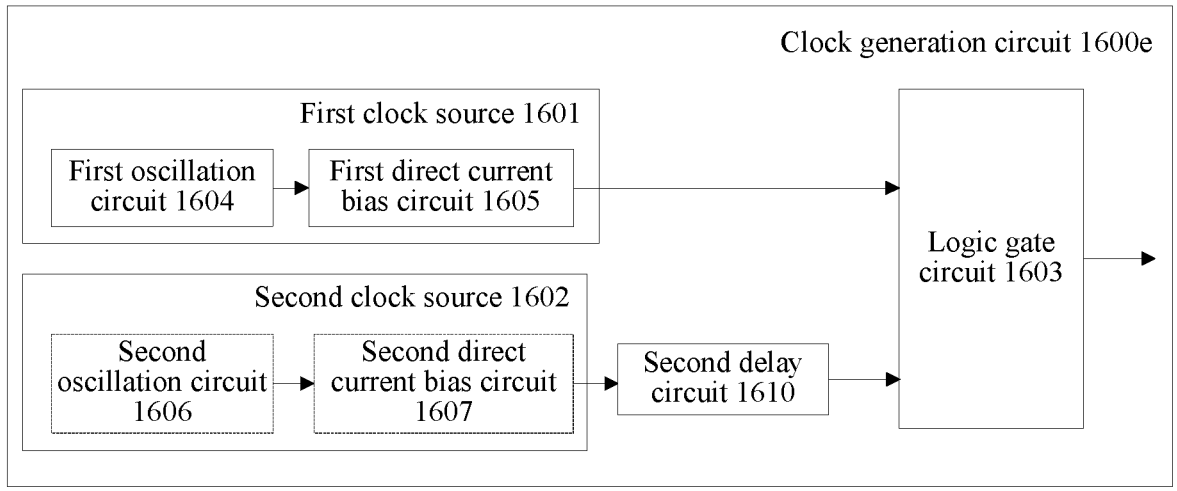
FIG. 20 shows a fifteenth clock generation circuit according to an embodiment of this application.

FIG. 20 is a schematic structural diagram of a clock generation circuit 1600*e*. The clock generation circuit 1600*e* shown in FIG. 20 is obtained by extending the clock generation circuit 1600 shown in FIG. 16. The following describes only technical content that is in the solution shown in FIG. 20 and that is different from the technical content in the solution shown in FIG. 16. For same technical content in the solution shown in FIG. 20 and in the solution shown in FIG. 16, details are not described below again. In the clock generation circuit 1600*e*, a second delay circuit 1610 may further be coupled between the second clock source 1602 and the logic gate circuit 1603.

The second delay circuit 1610 is configured to delay the third clock signal, so that a difference between a time at which the second clock source 1602 outputs the third clock signal and a time at which the logic gate circuit 1603 receives the third clock signal is the first duration.

Optionally, in an implementation in which the second clock source 1602 is a second clock source 1602*b* shown in FIG. 17, that is, in an example in which the second clock source 1602 includes a second oscillation circuit 1606 and a second direct current bias circuit 1607, the second delay circuit 1610 may be coupled between the second oscillation circuit 1606 and the second direct current bias circuit 1607 (this case is not shown in FIG. 20) to delay a fifth clock signal, so that a difference between a time at which the second oscillation circuit 1606 outputs the fifth clock signal and a time at which the second direct current bias circuit 1607 receives the fifth clock signal is the second duration. Alternatively, the second delay circuit 1610 may be coupled between the second direct current bias circuit 1607 and the logic gate circuit 1603 to delay the third clock signal, so that a difference between a time at which the second direct current bias circuit 1607 outputs the third clock signal and a time at which the logic gate circuit 1603 receives the third clock signal is the first duration.

For example, when the second delay circuit 1610 is coupled between the second direct current bias circuit 1607 and the logic gate circuit 1603 to delay the third clock signal, and the logic gate circuit 1603 performs an OR logical operation on the second clock signal and the delayed third clock signal, a rising edge of the delayed third clock signal is used as a rising edge of a clock signal output by the clock generation circuit 1600*e*.

For a specific implementation of the second delay circuit 1610, refer to the related description in FIG. 10.

Figure 21:
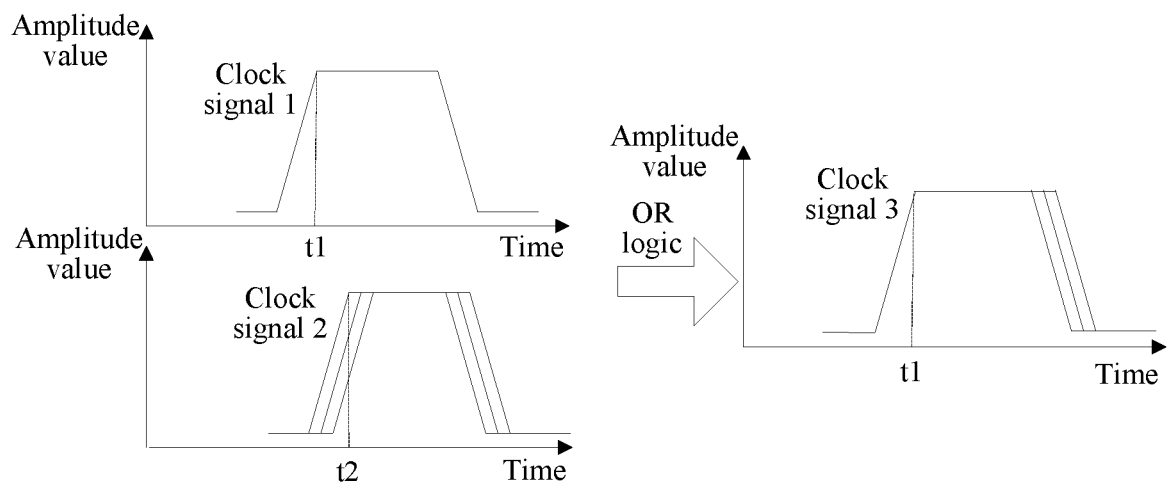
FIG. 21 is a schematic diagram of performing an OR logical operation on a delayed second clock signal and a delayed third clock signal.

As shown in FIG. 21, a clock signal 1 is the second clock signal, and a clock signal 2 is the delayed third clock signal. If in a digital circuit, a rising edge of a clock signal is used to trigger a status change, when a phase noise indicator of a rising edge of the first clock signal generated by the first oscillation circuit is relatively desirable (where after the first direct current bias circuit 1605 superimposes the first direct current voltage on the first clock signal, the phase noise indicator of the rising edge is not affected, that is, a phase noise indicator of the second clock signal is also relatively desirable), the second delay circuit 1510 may be coupled between the second oscillation circuit 1606 and the logic gate circuit 1603. Therefore, after the logic gate circuit 1603 performs an OR logical operation on the clock signal 1 and the clock signal 2, a rising edge of a generated clock signal 3 (that is, the fourth clock signal) is a rising edge of the clock signal 1 that has not been delayed, that is, a rising edge of a clock signal with a relatively desirable phase noise indicator.

Optionally, the first delay circuit 1609 and the second delay circuit 1610 may be both coupled in the clock generation circuit 1600. In this way, in view of a phase error between the third clock signal and the second clock signal, if a rising edge of one clock signal is to be selected as a rising edge of a clock signal output by the clock generation circuit 1600, a delay time of a delay circuit that corresponds to the clock signal may be set to be relatively short, even if the rising edge of the selected clock signal appears relatively early.

A main difference between the clock generation circuit 1600 and the clock generation circuit 300 lies in that, the first direct current voltage has different voltage values in the first direct current bias circuit 1605 and the first direct current bias circuit 305, the second direct current voltage has different voltage values in the second direct current bias circuit 1607 and the second direct current bias circuit 307, and types of logical operations performed by the logic gate circuit 1603 and the logic gate circuit 303 are different. Implementations of other parts and functions of the other parts in the clock generation circuit 1600 and the clock generation circuit 300 are similar. Therefore, for specific implementations and principles, cross reference may be made.

For example, a signal selection circuit and an output phase-locked loop circuit may be coupled in the clock generation circuit 1600. For specific implementations, refer to the signal selection circuit 311 and the output phase-locked loop circuit 312 in the clock generation circuit 300. Superimposing of a direct current voltage (that is, the first direct current voltage or the second direct current voltage) in the direct current bias circuit (that is, the first direct current bias circuit 1605 or the second direct current bias circuit 1607) in the clock generation circuit 1600 may be implemented using a bleeder circuit or an operational amplification circuit. For a specific implementation, refer to the description about the bleeder circuit or the operational amplification circuit in the clock generation circuit 300 in FIG. 12 or FIG. 13.

Figure 22:
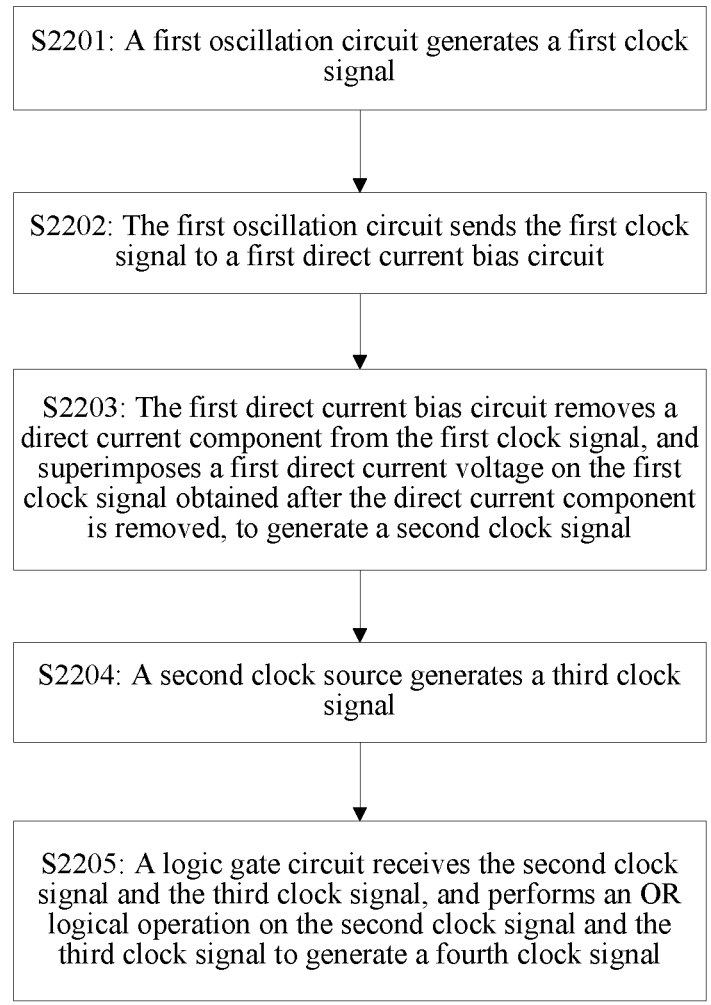
FIG. 22 is a flowchart of a second clock generation method according to an embodiment of this application.

An embodiment of this application provides a clock signal generation method. The method is applied to a clock generation circuit, the clock generation circuit includes a first clock source, a second clock source, and a logic gate circuit, and the first clock source includes a first oscillation circuit and a first direct current bias circuit. As shown in FIG. 22, the method includes the following operations.

Operation S2201: The first oscillation circuit generates a first clock signal.

Operation S2202: The first oscillation circuit sends the first clock signal to the first direct current bias circuit.

Operation S2203: The first direct current bias circuit removes a direct current component from the first clock signal, and superimposes a first direct current voltage on the first clock signal obtained after the direct current component is removed, to generate a second clock signal.

A voltage value of the first direct current voltage is less than a low-level decision threshold of the logic gate circuit, and the voltage value of the first direct current voltage is greater than a difference between a high-level decision threshold of the logic gate circuit and a high-level voltage value of the second clock signal.

Operation S2204: The second clock source generates a third clock signal.

A difference between frequencies of the third clock signal and the second clock signal is less than a first preset value.

Operation S2205: The logic gate circuit receives the second clock signal and the third clock signal, and performs an OR logical operation on the second clock signal and the third clock signal to generate a fourth clock signal.

Optionally, the second clock source includes a second oscillation circuit and a second direct current bias circuit; and the generating, by the second clock source, a third clock signal specifically includes:

generating, by the second oscillation circuit, a fifth clock signal; and sending, by the second oscillation circuit, the fifth clock signal to the second direct current bias circuit; and removing, by the second direct current bias circuit, a direct current component from the fifth clock signal, and superimposing a second direct current voltage on the fifth clock signal obtained after the direct current component is removed, to generate the third clock signal, where a voltage value of the second direct current voltage is greater than the high-level decision threshold of the logic gate circuit, and the voltage value of the second direct current voltage is greater than a difference between the high-level decision threshold of the logic gate circuit and a high-level voltage value of the fifth clock signal.

Optionally, the second clock source is a controlled clock source, and the clock generation circuit further includes a control circuit. The method further includes:

generating, by the control circuit, a control signal according to a phase difference and/or a frequency difference between the second clock signal and the third clock signal, and sending the control signal to the second clock source; and the control signal is used to control the frequency of the third clock signal, so that an absolute value of the difference between the frequency of the third clock signal and the frequency of the second clock signal is less than the first preset value.

Optionally, the clock generation circuit further includes a first delay circuit, and the method further includes:

delaying, by the first delay circuit, the second clock signal, so that a difference between a time at which the first direct current bias circuit outputs the second clock signal and a time at which the logic gate circuit receives the second clock signal is first duration; or delaying, by the first delay circuit, the first clock signal, so that a difference between a time at which the first oscillation circuit outputs the first clock signal and a time at which the first direct current bias circuit receives the first clock signal is second duration.

Optionally, the clock generation circuit further includes a second delay circuit, and the method further includes:

delaying, by the second delay circuit, the third clock signal, so that a difference between a time at which the second clock source outputs the third clock signal and a time at which the logic gate circuit receives the third clock signal is first duration.

Optionally, the clock generation circuit further includes a second delay circuit, and the method further includes:

delaying, by the second delay circuit, the third clock signal, so that a difference between a time at which the second direct current bias circuit outputs the third clock signal and a time at which the logic gate circuit receives the third clock signal is first duration; or delaying, by the second delay circuit, the fifth clock signal, so that a difference between a time at which the second oscillation circuit outputs the fifth clock signal and a time at which the second direct current bias circuit receives the fifth clock signal is second duration.

Optionally, a time at which the logic gate circuit receives a falling edge of the second clock signal is earlier than a time at which the logic gate circuit receives a falling edge of the third clock signal, and a difference between the time at which the logic gate circuit receives the falling edge of the second clock signal and the time at which the logic gate circuit receives the falling edge of the third clock signal is less than low-level duration of the second clock signal. Alternatively, a time at which the logic gate circuit receives a falling edge of the second clock signal is later than a time at which the logic gate circuit receives a falling edge of the third clock signal, and a difference between the time at which the logic gate circuit receives the falling edge of the third clock signal and the time at which the logic gate circuit receives the falling edge of the second clock signal is less than low-level duration of the third clock signal.

The clock signal generation method shown in FIG. 22 may be implemented using the clock signal generation method by the foregoing clock generation circuit 1600, and the extension solutions of the clock generation circuit 1600. For content that is not described in detail in the method shown in FIG. 22, refer to corresponding descriptions in the clock generation circuit 1600 and the extension solutions of the clock generation circuit 1600.

In this embodiment of this application, a direct current bias circuit in a first clock source superimposes a first direct current voltage on a first clock signal output by a first oscillation circuit, to generate a second clock signal; and a logical operation is performed on the second clock signal and a third clock signal that is generated by a second clock source, to generate a fourth clock signal. Therefore, when the first oscillation circuit cannot normally work, a clock generation circuit can still output a correct clock signal. This avoids clock signal interruption when switching is performed from the first clock source to the second clock source.

In addition, different from that a more accurate clock signal needs to be provided to a clock existence detection module and a phase difference detection module so that the clock existence detection module and the phase difference detection module can work, during implementation of this embodiment of this application, no extra clock signal needs to be provided using the clock generation circuit provided in this embodiment of this application. Therefore, accuracy and reliability are higher.

Persons skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and operations are performed on the computer or the another programmable device, thereby generating computer-implemented processing. Therefore, the instructions executed on the computer or the another programmable device provide operations for implementing a specific function in one or more processes in the flowcharts and/or in one or more blocks in the block diagrams.

Although some preferred embodiments of this application have been described, persons skilled in the art can make changes and modifications to these embodiments once they learn the basic inventive concept. Therefore, the following claims are intended to be construed as to cover the preferred embodiments and all changes and modifications falling within the scope of this application.

The clock generation circuit provided in the foregoing embodiments is described using division of the foregoing function modules as an example. In practical application, the foregoing functions can be allocated to different modules and implemented according to a requirement, that is, an inner structure of a device is divided into different function modules to implement all or some of the functions described above.

The embodiments in this specification are all described in a progressive manner, for same or similar parts in the embodiments, reference may be made to these embodiments, and each embodiment focuses on a difference from other embodiments. Especially, a method embodiment is basically similar to an apparatus embodiment, and therefore is described briefly; for related parts, reference may be made to partial descriptions in the method embodiment. Obviously, persons skilled in the art can make various modifications and variations to the embodiments of this application without departing from the spirit and scope of the embodiments of the present invention. This application is intended to cover these modifications and variations provided that they fall within the scope of protection defined by the following claims and their equivalent technologies.

What is claimed is:

1. A clock generation circuit, comprising a first clock source, a second clock source, and a logic gate circuit, wherein the first clock source is coupled to the logic gate circuit and the second clock source is coupled to the logic gate circuit, the first clock source comprises a first oscillation circuit and a first direct current bias circuit, the first oscillation circuit is coupled to the first direct current bias circuit, and the first direct current bias circuit is coupled to the logic gate circuit, wherein
   the first oscillation circuit is configured to generate a first clock signal;
   the first direct current bias circuit is configured to: remove a direct current component from the first clock signal, and superimpose a first direct current voltage on the first clock signal obtained after the direct current component is removed, to generate a second clock signal, wherein a voltage value of the first direct current voltage is greater than a high-level decision threshold of the logic gate circuit, and the voltage value of the first direct current voltage is less than a difference between a low-level decision threshold of the logic gate circuit and a low-level voltage value of the first clock signal;

the second clock source is configured to generate a third clock signal, wherein an absolute value of a difference between a frequency of the third clock signal and a frequency of the second clock signal is less than a first preset value; and the logic gate circuit is configured to: receive the second clock signal and the third clock signal, and perform an AND logical operation on the second clock signal and the third clock signal to generate a fourth clock signal.

2. The clock generation circuit according to claim 1, wherein the second clock source comprises a second oscillation circuit and a second direct current bias circuit, the second oscillation circuit is coupled to the second direct current bias circuit, and the second direct current bias circuit is coupled to the logic gate circuit, wherein the second oscillation circuit is configured to generate a fifth clock signal; and the second direct current bias circuit is configured to: remove a direct current component from the fifth clock signal, and superimpose a second direct current voltage on the fifth clock signal obtained after the direct current component is removed, to generate the third clock signal, wherein a voltage value of the second direct current voltage is greater than the high-level decision threshold of the logic gate circuit, and the voltage value of the second direct current voltage is less than a difference between the low-level decision threshold of the logic gate circuit and a low-level voltage value of the fifth clock signal.

3. The clock generation circuit according to claim 1, wherein the second clock source is a controlled clock source, and the clock generation circuit further comprises a control circuit, wherein the control circuit is configured to: generate a control signal according to a phase difference and/or a frequency difference between the second clock signal and the third clock signal, and send the control signal to the second clock source; and the control signal is used to control the frequency of the third clock signal, so that the absolute value of the difference between the frequency of the third clock signal and the frequency of the second clock signal is less than the first preset value.

4. The clock generation circuit according to claim 1, wherein a first delay circuit is further coupled between the first oscillation circuit and the logic gate circuit; and the first delay circuit is configured to delay the second clock signal, so that a difference between a time at which the first direct current bias circuit outputs the second clock signal and a time at which the logic gate circuit receives the second clock signal is first duration; or the first delay circuit is configured to delay the first clock signal, so that a difference between a time at which the first oscillation circuit outputs the first clock signal and a time at which the first direct current bias circuit receives the first clock signal is second duration.

5. The clock generation circuit according to claim 1, wherein a second delay circuit is further coupled between the second clock source and the logic gate circuit; and the second delay circuit is configured to delay the third clock signal, so that a difference between a time at which the second clock source outputs the third clock signal and a time at which the logic gate circuit receives the third clock signal is first duration.

6. The clock generation circuit according to claim 2, wherein a second delay circuit is further coupled between the second oscillation circuit and the logic gate circuit; and the second delay circuit is configured to delay the third clock signal, so that a difference between a time at which the second direct current bias circuit outputs the third clock signal and a time at which the logic gate circuit receives the third clock signal is first duration; or the second delay circuit is configured to delay the fifth clock signal, so that a difference between a time at which the second oscillation circuit outputs the fifth clock signal and a time at which the second direct current bias circuit receives the fifth clock signal is second duration.

7. The clock generation circuit according to claim 1, wherein a time at which the logic gate circuit receives a rising edge of the second clock signal is earlier than a time at which the logic gate circuit receives a rising edge of the third clock signal, and a difference between the time at which the logic gate circuit receives the rising edge of the second clock signal and the time at which the logic gate circuit receives the rising edge of the third clock signal is less than high-level duration of the second clock signal; or a time at which the logic gate circuit receives a rising edge of the second clock signal is later than a time at which the logic gate circuit receives a rising edge of the third clock signal, and a difference between the time at which the logic gate circuit receives the rising edge of the third clock signal and the time at which the logic gate circuit receives the rising edge of the second clock signal is less than high-level duration of the third clock signal.

8. A clock signal generation method, wherein the method is applied to a clock generation circuit, the clock generation circuit comprises a first clock source, a second clock source, and a logic gate circuit, and the first clock source comprises a first oscillation circuit and a first direct current bias circuit; and the method comprises:

generating, by the first oscillation circuit, a first clock signal;

sending, by the first oscillation circuit, the first clock signal to the first direct current bias circuit;

removing, by the first direct current bias circuit, a direct current component from the first clock signal, and superimposing a first direct current voltage on the first clock signal obtained after the direct current component is removed, to generate a second clock signal, wherein a voltage value of the first direct current voltage is greater than a high-level decision threshold of the logic gate circuit, and the voltage value of the first direct current voltage is less than a difference between a low-level decision threshold of the logic gate circuit and a low-level voltage value of the first clock signal;

generating, by the second clock source, a third clock signal, wherein a difference between frequencies of the third clock signal and the second clock signal is less than a first preset value; and receiving, by the logic gate circuit, the second clock signal and the third clock signal, and performing an AND logical operation on the second clock signal and the third clock signal to generate a fourth clock signal.

9. The method according to claim 8, wherein the second clock source comprises a second oscillation circuit and a second direct current bias circuit; and the generating, by the second clock source, a third clock signal specifically comprises:

generating, by the second oscillation circuit, a fifth clock signal; and sending, by the second oscillation circuit, the fifth clock signal to the second direct current bias circuit; and removing, by the second direct current bias circuit, a direct current component from the fifth clock signal, and superimposing a second direct current voltage on the fifth clock signal obtained after the direct current component is removed, to generate the third clock signal, wherein a voltage value of the second direct current voltage is greater than the high-level decision threshold of the logic gate circuit, and the voltage value of the second direct current voltage is less than a difference between the low-level decision threshold of the logic gate circuit and a low-level voltage value of the fifth clock signal.

10. The method according to claim 8, wherein the second clock source is a controlled clock source, and the clock generation circuit further comprises a control circuit; and the method further comprises:

generating, by the control circuit, a control signal according to a phase difference and/or a frequency difference between the second clock signal and the third clock signal, and sending the control signal to the second clock source; and the control signal is used to control the frequency of the third clock signal, so that an absolute value of the difference between the frequency of the third clock signal and the frequency of the second clock signal is less than the first preset value.

11. The method according to claim 8, wherein the clock generation circuit further comprises a first delay circuit, and the method further comprises:

delaying, by the first delay circuit, the second clock signal, so that a difference between a time at which the first direct current bias circuit outputs the second clock signal and a time at which the logic gate circuit receives the second clock signal is first duration; or delaying, by the first delay circuit, the first clock signal, so that a difference between a time at which the first oscillation circuit outputs the first clock signal and a time at which the first direct current bias circuit receives the first clock signal is second duration.

12. The method according to claim 8, wherein the clock generation circuit further comprises a second delay circuit, and the method further comprises:

delaying, by the second delay circuit, the third clock signal, so that a difference between a time at which the second clock source outputs the third clock signal and a time at which the logic gate circuit receives the third clock signal is first duration.

13. The method according to claim 9, wherein the clock generation circuit further comprises a second delay circuit, and the method further comprises:

delaying, by the second delay circuit, the third clock signal, so that a difference between a time at which the second direct current bias circuit outputs the third clock signal and a time at which the logic gate circuit receives the third clock signal is first duration; or delaying, by the second delay circuit, the fifth clock signal, so that a difference between a time at which the second oscillation circuit outputs the fifth clock signal and a time at which the second direct current bias circuit receives the fifth clock signal is second duration.

14. The method according to claim 8, wherein a time at which the logic gate circuit receives a rising edge of the second clock signal is earlier than a time at which the logic gate circuit receives a rising edge of the third clock signal, and a difference between the time at which the logic gate circuit receives the rising edge of the second clock signal and the time at which the logic gate circuit receives the rising edge of the third clock signal is less than high-level duration of the second clock signal; or a time at which the logic gate circuit receives a rising edge of the second clock signal is later than a time at which the logic gate circuit receives a rising edge of the third clock signal, and a difference between the time at which the logic gate circuit receives the rising edge of the third clock signal and the time at which the logic gate circuit receives the rising edge of the second clock signal is less than high-level duration of the third clock signal.

15. A clock generation circuit, comprising a first clock source, a second clock source, and a logic gate circuit, wherein the first clock source is coupled to the logic gate circuit and the second clock source is coupled to the logic gate circuit, the first clock source comprises a first oscillation circuit and a first direct current bias circuit, the first oscillation circuit is coupled to the first direct current bias circuit, and the first direct current bias circuit is coupled to the logic gate circuit, wherein the first oscillation circuit is configured to generate a first clock signal;

the first direct current bias circuit is configured to: remove a direct current component from the first clock signal, and superimpose a first direct current voltage on the first clock signal obtained after the direct current component is removed, to generate a second clock signal, wherein a voltage value of the first direct current voltage is less than a low-level decision threshold of the logic gate circuit, and the voltage value of the first direct current voltage is greater than a difference between a high-level decision threshold of the logic gate circuit and a high-level voltage value of the first clock signal;

the second clock source is configured to generate a third clock signal, wherein an absolute value of a difference between a frequency of the third clock signal and a frequency of the second clock signal is less than a first preset value; and the logic gate circuit is configured to: receive the second clock signal and the third clock signal, and perform an OR logical operation on the second clock signal and the third clock signal to generate a fourth clock signal.

16. The clock generation circuit according to claim 15, wherein the second clock source comprises a second oscillation circuit and a second direct current bias circuit, the second oscillation circuit is coupled to the second direct current bias circuit, and the second direct current bias circuit is coupled to the logic gate circuit, wherein the second oscillation circuit is configured to generate a fifth clock signal; and the second direct current bias circuit is configured to: remove a direct current component from the fifth clock signal, and superimpose a second direct current voltage on the fifth clock signal obtained after the direct current component is removed, to generate the third clock signal, wherein a voltage value of the second direct current voltage is less than the low-level decision threshold of the logic gate circuit, and the voltage value of the second direct current voltage is greater than a difference between the high-level decision threshold of the logic gate circuit and a high-level voltage value of the fifth clock signal.

17. The clock generation circuit according to claim 15, wherein the second clock source is a controlled clock source, and the clock generation circuit further comprises a control circuit, wherein the control circuit is configured to: generate a control signal according to a phase difference and/or a frequency difference between the second clock signal and the third clock signal, and send the control signal to the second clock source; and the control signal is used to control the frequency of the third clock signal, so that an absolute value of the difference between the frequency of the third clock signal and the frequency of the second clock signal is less than the first preset value.

18. The clock generation circuit according to claim 15, wherein a first delay circuit is further coupled between the first oscillation circuit and the logic gate circuit; and the first delay circuit is configured to delay the second clock signal, so that a difference between a time at which the first direct current bias circuit outputs the second clock signal and a time at which the logic gate circuit receives the second clock signal is first duration; or the first delay circuit is configured to delay the first clock signal, so that a difference between a time at which the first oscillation circuit outputs the first clock signal and a time at which the first direct current bias circuit receives the first clock signal is second duration.

19. The clock generation circuit according to claim 15, wherein a second delay circuit is further coupled between the second clock source and the logic gate circuit; and the second delay circuit is configured to delay the third clock signal, so that a difference between a time at which the second clock source outputs the third clock signal and a time at which the logic gate circuit receives the third clock signal is first duration.

20. The clock generation circuit according to claim 16, wherein a second delay circuit is further coupled between the second oscillation circuit and the logic gate circuit; and the second delay circuit is configured to delay the third clock signal, so that a difference between a time at which the second direct current bias circuit outputs the third clock signal and a time at which the logic gate circuit receives the third clock signal is first duration; or the second delay circuit is configured to delay the fifth clock signal, so that a difference between a time at which the second oscillation circuit outputs the fifth clock signal and a time at which the second direct current bias circuit receives the fifth clock signal is second duration.

\* \* \* \* \*